(12) United States Patent
Lee et al.

(10) Patent No.: US 12,250,856 B2
(45) Date of Patent: Mar. 11, 2025

(54) DISPLAY APPARATUS

(71) Applicant: Samsung Display Co., Ltd., Yongin-Si (KR)

(72) Inventors: Kyunghoe Lee, Yongin-si (KR); Cheolgon Lee, Yongin-si (KR); Mukyung Jeon, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 373 days.

(21) Appl. No.: 17/573,417

(22) Filed: Jan. 11, 2022

(65) Prior Publication Data

US 2022/0344440 A1 Oct. 27, 2022

(30) Foreign Application Priority Data

Apr. 26, 2021 (KR) .......................... 10-2021-0053753

(51) Int. Cl.
*H10K 59/131* (2023.01)
*H10K 59/12* (2023.01)
*H10K 59/121* (2023.01)
*H10K 59/122* (2023.01)
*H10K 59/124* (2023.01)

(52) U.S. Cl.
CPC ......... *H10K 59/131* (2023.02); *H10K 59/121* (2023.02); *H10K 59/124* (2023.02); *H10K 59/1201* (2023.02); *H10K 59/122* (2023.02)

(58) Field of Classification Search
CPC .. H10K 59/131; H10K 59/121; H10K 59/124; H10K 59/1201; H10K 59/122; H10K 59/1315; H10K 59/80522; H10K 59/352; H10K 59/123; H10K 59/353; H10K 71/821; H01L 27/1248
See application file for complete search history.

(56) References Cited

U.S. PATENT DOCUMENTS

| | | | |
|---|---|---|---|
| 7,947,519 B2 | 5/2011 | Lee et al. | |
| 9,595,575 B2 | 3/2017 | Cho et al. | |
| 9,614,016 B2 | 4/2017 | Choi et al. | |
| 11,288,998 B2* | 3/2022 | Lee ...................... | G09G 3/3225 |
| 2016/0035813 A1 | 2/2016 | Lee et al. | |
| 2020/0185470 A1* | 6/2020 | Son ...................... | H10K 59/123 |
| 2020/0258953 A1* | 8/2020 | Bae ........................ | H01K 59/60 |
| 2020/0365667 A1* | 11/2020 | Jo ........................ | H10K 59/1213 |
| 2021/0065625 A1 | 3/2021 | Wang et al. | |
| 2021/0241671 A1* | 8/2021 | Lee ...................... | G09G 3/2003 |
| 2021/0313539 A1* | 10/2021 | Jeon ...................... | H10K 59/124 |

(Continued)

FOREIGN PATENT DOCUMENTS

| | | |
|---|---|---|
| KR | 10-0590259 B1 | 6/2006 |
| KR | 10-2016-0017327 A | 2/2016 |

(Continued)

*Primary Examiner* — Victor A Mandala
(74) *Attorney, Agent, or Firm* — Innovation Counsel LLP

(57) ABSTRACT

A display apparatus including a display area including a first area having a first resolution and a second area having a second resolution that is lower than the first resolution and a non-display area comprises a conductive pattern arranged in the second area of the display area, a pixel electrode arranged in the second area, an opposite electrode facing the pixel electrode and contacting the conductive pattern, and a first electrode layer arranged in the non-display area and contacting the opposite electrode.

20 Claims, 28 Drawing Sheets

(56) References Cited

U.S. PATENT DOCUMENTS

| | | | |
|---|---|---|---|
| 2021/0320164 A1* | 10/2021 | Lee | G09G 3/3258 |
| 2021/0335987 A1* | 10/2021 | Kim | H04N 23/51 |
| 2022/0077430 A1* | 3/2022 | Choi | H10K 59/8792 |
| 2022/0165996 A1* | 5/2022 | Bae | H10K 71/00 |
| 2023/0269983 A1* | 8/2023 | Cha | G09G 3/3233 |
| | | | 257/40 |

FOREIGN PATENT DOCUMENTS

| | | |
|---|---|---|
| KR | 10-2016-0053357 A | 5/2016 |
| KR | 10-2020-0087251 A | 7/2020 |
| KR | 10-2020-0099251 A | 8/2020 |
| KR | 10-2148935 B1 | 8/2020 |
| KR | 10-2020-0131398 A | 11/2020 |

* cited by examiner

DISPLAY APPARATUS

CROSS-REFERENCE TO RELATED APPLICATION

This application is based on and claims priority under 35 U.S.C. § 119 to Korean Patent Application No. 10-2021-0053753, filed on Apr. 26, 2021, in the Korean Intellectual Property Office, the disclosure of which is incorporated by reference herein in its entirety.

BACKGROUND

1. Field

The present disclosure generally relates to a display apparatus. More particularly, the present disclosure relates to a display apparatus in which a low-resolution area is uniformly arranged in a high-resolution area and a conductive pattern contacting a cathode is arranged on the same layer as a pixel electrode in a low-resolution area.

2. Description of the Related Art

Organic light emitting display apparatuses, which are self-luminous display apparatuses, are attracting the attention as next-generation display apparatuses, because they may be driven with a low voltage, may have a light and thin configuration because of not requiring a separate light source and may have high-quality characteristics such as a wide viewing angle, high contrast, and a high response rate.

SUMMARY

One or more embodiments include high-quality display apparatuses.

Additional aspects will be set forth in part in the description which follows and, in part, will be apparent from the description, or may be learned by practice of the presented embodiments.

According to one or more embodiments, a display apparatus including a display area including a first area of a first resolution and a second area of a second resolution that is lower than the first resolution and a non-display area includes a conductive pattern arranged in the second area of the display area, a pixel electrode arranged in the second area, an opposite electrode facing the pixel electrode and contacting the conductive pattern, and a first electrode layer arranged in the non-display area and contacting the opposite electrode.

The conductive pattern may be arranged on a same layer as the pixel electrode.

The display apparatus may include an insulating layer covering an edge of the pixel electrode and having defined therein a first opening corresponding to a portion of the pixel electrode and a second opening corresponding to a portion of the conductive pattern.

A third opening corresponding to a portion of a pixel electrode arranged in the first area may be further formed in the insulating layer, and a size of the first opening may be greater than a size of the third opening.

The display apparatus may further include a second electrode layer arranged on a layer between a substrate and the conductive pattern and contacting the conductive pattern in the second area.

The display apparatus may further include a first insulating layer covering the second electrode layer and having defined therein a first opening corresponding to a portion of the second electrode layer in the second area, and a second insulating layer arranged over the first insulating layer, covering an edge of the pixel electrode, and having defined therein a second opening corresponding to a portion of the pixel electrode and a third opening corresponding to a portion of the conductive pattern, wherein the third opening may overlap the first opening.

A fourth opening corresponding to a portion of a pixel electrode arranged in the first area may be further defined in the second insulating layer, and a size of the second opening may be greater than a size of the fourth opening.

The second electrode layer may be electrically connected to the first electrode layer in the non-display area.

The first electrode layer may include a same material as the pixel electrode.

The second display area may be distributedly arranged in the display area.

The first electrode layer may be electrically connected to the second electrode layer including the conductive pattern as a portion in the non-display area.

The first electrode layer may overlap a driving circuit of the non-display area.

An emission area of an organic light emitting diode including a pixel electrode arranged in the second display area may be larger than an emission area of an organic light emitting diode including a pixel electrode arranged in the first display area.

According to one or more embodiments, a method of manufacturing a display apparatus including a display area including a first area of a first resolution and a second area of a second resolution that is lower than the first resolution and a non-display area includes forming a first pixel electrode in the first area of the display area and forming a second pixel electrode in the second area of the display area, forming a conductive pattern in the second area of the display area, and forming an opposite electrode facing the first pixel electrode and the second pixel electrode, contacting the conductive pattern in the second area, and contacting, in the non-display area, a first electrode layer arranged in the non-display area.

The conductive pattern may be formed on a same layer as the second pixel electrode.

The method may further include forming a pixel definition layer covering the first pixel electrode, the second pixel electrode, and the conductive pattern, and forming, in the pixel definition layer, a first opening corresponding to the first pixel electrode, a second opening corresponding to the second pixel electrode, and a third opening corresponding to the conductive pattern, wherein the opposite electrode may cover the third opening and contact the conductive pattern in the third opening.

The method may further include forming an emission layer in each of the first opening and the second opening, forming a functional layer covering the first opening, the second opening, and the third opening, and removing the functional layer in an area in the third opening corresponding to the conductive pattern by laser drilling, wherein the opposite electrode may contact the conductive pattern in the area in the third opening where the functional layer is removed.

The method may further include forming a second electrode layer contacting the conductive pattern in the second area on a layer between a substrate and the conductive pattern.

The second electrode layer may be electrically connected to the first electrode layer in the non-display area.

The first electrode layer may be electrically connected to the second electrode layer including the conductive pattern as a portion in the non-display area.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
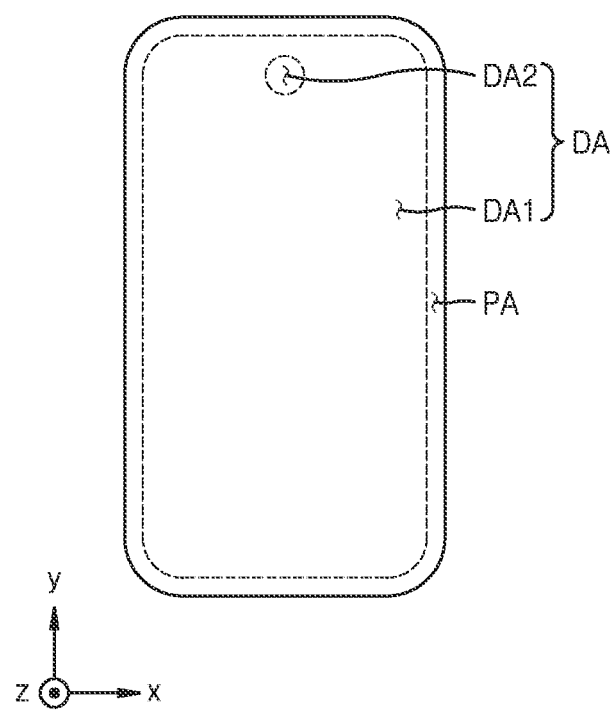
FIG. 1 is a plan view schematically illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

Hereinafter, embodiments will be described in detail with reference to the accompanying drawings, and in the following description, like reference numerals will denote like elements and redundant descriptions thereof will be omitted for conciseness.

It will be understood that when an element such as a layer, a region, or a plate is referred to as being "on" another element, it may be "directly on" the element or may be "indirectly on" the other element with one or more intervening elements therebetween. Also, sizes of elements in the drawings may be exaggerated for convenience of description. In other words, because the sizes and thicknesses of elements in the drawings are arbitrarily illustrated for convenience of description, the disclosure is not limited thereto.

In the following embodiments, when referred to as "in a plan view," it may mean that a target portion is viewed from above, and when referred to as "in a cross-sectional view," it may mean that a cross-section of a target portion vertically cut is viewed from side. In the following embodiments, when a first element "overlaps" a second element, the first element may be located over or under the second element.

Also, herein, the x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

When a certain embodiment may be implemented differently, a particular process order may be performed differently from the described order. For example, two consecutively described processes may be performed substantially at the same time or may be performed in an order opposite to the described order.

In the detailed description of the disclosure and the appended claims, the term "corresponding" may be used to specify an element arranged in the same area among a plurality of elements, depending on the context. That is, when a first element "corresponds" to a second element, it may mean that the second element is arranged on the same area as the first element.

Figure 2A:
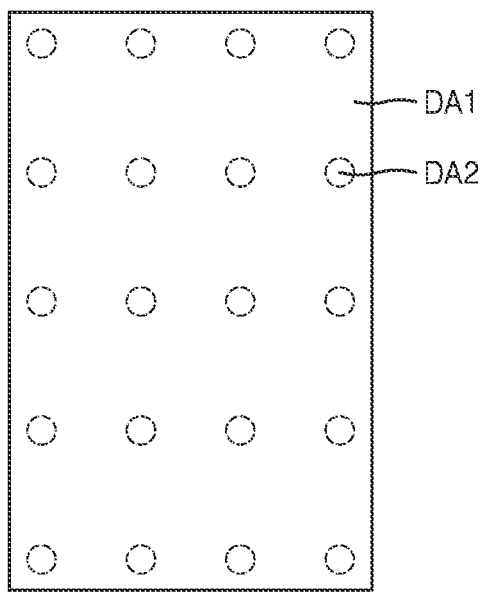
FIGS. 2A, 2B, and 2C are diagrams schematically illustrating a portion of a display area of FIG. 1 according to an embodiment.
Figure 2B:
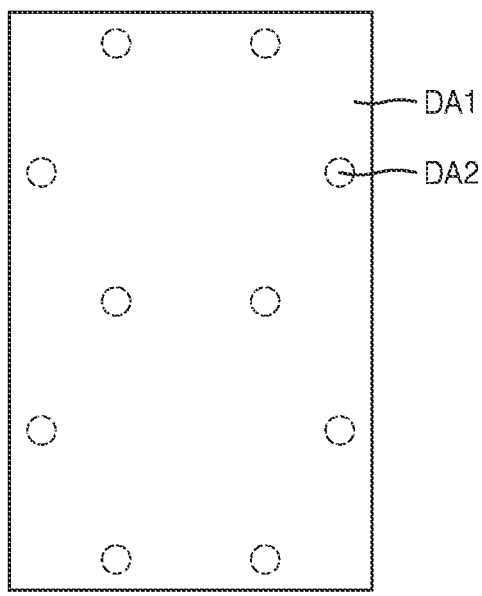
Figure 2C:
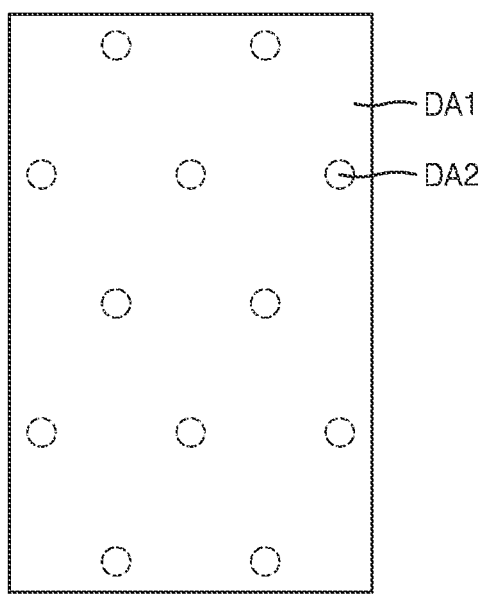

FIG. 1 is a plan view schematically illustrating a display apparatus according to an embodiment. FIGS. 2A, 2B, and 2C are diagrams schematically illustrating a portion of a display area of FIG. 1 according to an embodiment.

A display apparatus 1 according to embodiments may be implemented as an electronic apparatus such as a smart phone, a mobile phone, a navigation apparatus, a game machine, a television (TV), a vehicle head unit, a notebook computer, a laptop computer, a tablet computer, a personal media player (PMP), or a personal digital assistant (PDA). Also, the electronic apparatus may be a flexible apparatus.

The display apparatus 1 may include a display area DA and a peripheral area PA outside the display area DA. In the plan view, the display area DA may have a rectangular shape, as illustrated in FIG. 1. In other embodiments, the display area DA may have a polygonal shape such as a triangular, pentagonal, or hexagonal shape, a circular shape, an elliptical shape, an atypical shape, or the like. A corner of the edge of the display area DA may have a round shape. The peripheral area PA may be a type of non-display area in which display elements are not arranged. The display area DA may be entirely surrounded by the peripheral area PA.

Pixels including various display elements such as organic light emitting diodes OLED may be arranged in the display area DA. The pixels may include a plurality of pixels, and the plurality of pixels may be arranged in various forms such as a stripe arrangement, a pentile arrangement, and a mosaic arrangement in the x-direction and the y-direction to implement an image.

The display area DA may include a first display area DA1 and a second display area DA2. A portion of the display area DA may be set as the second display area DA2. The first display area DA1 may be an area in which pixels are arranged in a first resolution, and the second display area DA2 may be an area in which pixels are arranged in a second resolution which is lower than the first resolution in the first display area DA1. In a view in a direction substantially perpendicular to the upper surface of the display apparatus 1, the second display area DA2 may have various shapes such as circular shapes, elliptical shapes, polygonal shapes such as tetragonal shapes, star shapes, or diamond shapes.

As illustrated in FIGS. 2A, 2B and 2C, two or more second display areas DA2 may be arranged in the display area DA. The second display areas DA2 may be spaced apart from each other by a certain distance in a certain pattern along a first direction and a second direction which is perpendicular to the first direction. That is, the second display areas DA2 may be distributed in the display area DA. In an embodiment, the second display areas DA2 may be uniformly arranged in the display area DA. As illustrated in FIG. 2A, the second display areas DA2 may be arranged in a grid form. As illustrated in FIG. 2B, the second display areas DA2 may be arranged in a honeycomb form. As illustrated in FIG. 2C, the second display areas DA2 may be arranged in a diamond form. The arrangements of the second display areas DA2 illustrated in FIGS. 2A, 2B and 2C are merely examples, and the second display areas DA2 may be arranged in various forms such as circular shapes, elliptical shapes, polygonal shapes such as triangular shapes, star shapes, or diamond shapes.

In an embodiment, a component may be arranged as an electronic element under a display panel to correspond to the second display area DA2. The component may be a camera, an illuminance sensor, a proximity sensor, an iris sensor, or the like.

Hereinafter, for convenience, an organic light emitting display apparatus including an organic light emitting diode as a display element will be described as an example. However, the display apparatus of the disclosure is not limited thereto. In other embodiments, the display apparatus may include various types of display apparatuses such as an inorganic light emitting display apparatus (or an inorganic electroluminescence (EL) display apparatus), a nano light emitting display apparatus, and a quantum dot light emitting display apparatus.

Figure 3:
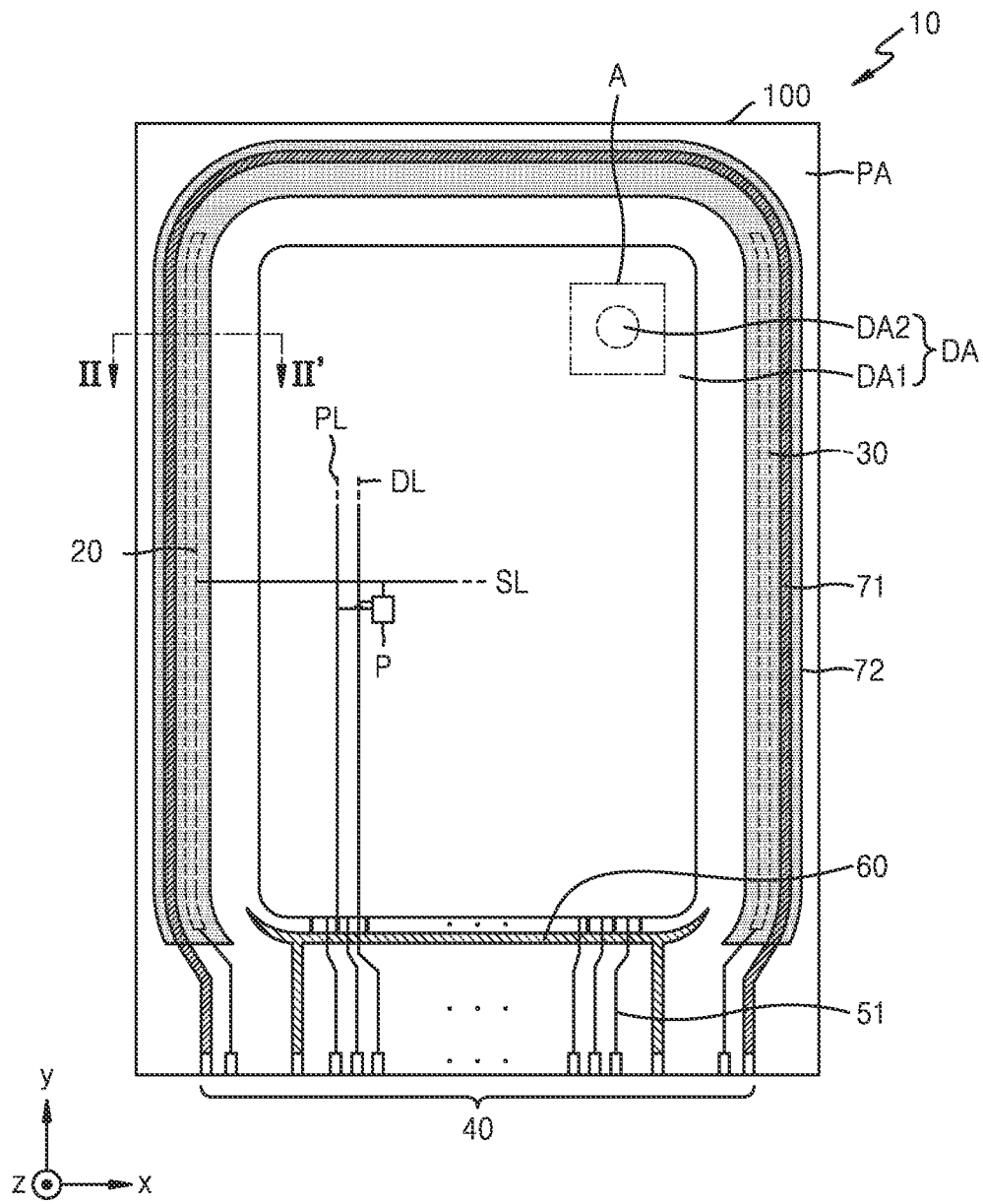
FIG. 3 is a plan view schematically illustrating a display panel that may be included in the display apparatus of FIG. 1 according to an embodiment.
Figure 3:
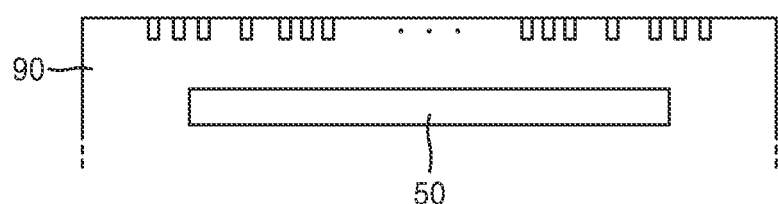

FIG. 3 is a plan view schematically illustrating a display panel that may be included in the display apparatus of FIG. 1 according to an embodiment.

Referring to FIG. 3, a display panel 10 may include a display area DA and a peripheral area PA surrounding the display area DA. The display area DA may include a first display area DA1 and a second display area DA2. The first display area DA1 may have a first resolution, and the second display area DA2 may have a second resolution that is lower than the first resolution. That is, the number of pixels arranged per unit area in the second display area DA2 may be less than the number of pixels arranged per unit area in the first display area DA1.

Various components constituting the display panel 10 may be arranged over a substrate 100. Thus, it may be considered that the substrate 100 includes the display area DA including the first display area DA1 and the second display area DA2 and the peripheral area PA surrounding the display area DA.

Pixels P connected to a scan line SL extending in the x-direction and a data line DL extending in the y-direction intersecting with the x-direction may be arranged in the display area DA.

Each pixel P may emit, for example, red, green, or blue light. Alternatively, each pixel P may emit red, green, blue, or white light. Each pixel P may include a display element, and the display element may include an organic light emitting diode. The display element may be connected to a pixel circuit driving the display element. An image may be provided through the light emitted from the pixels P. In this description, the pixel P may represent a subpixel emitting light of any one color of red, green, and blue (or white).

The peripheral area PA may be arranged outside the display area DA. For example, the peripheral area PA may surround the display area DA. That is, the peripheral area PA may surround the first display area DA1 and the second display area DA2. The peripheral area PA may be an area in which pixels PX are not arranged and may correspond to a non-display area that does not provide an image.

First and second scan driving circuits 20 and 30, a terminal unit 40, a driving voltage supply line 60, and a common voltage supply line 71 for driving the pixel circuit may be arranged in the peripheral area PA.

The first and second scan driving circuits 20 and 30 may be arranged in the peripheral area PA of the substrate 100 along the y-direction and may be configured to generate and transmit a scan signal to each pixel P through the scan line SL. For example, the first scan driving circuit 20 may be arranged on the left side of the display area DA and the second scan driving circuit 30 may be arranged on the right side of the display area DA. That is, the first scan driving circuit 20 may be disposed with the second scan driving circuit 30 in parallel along the y-direction. However, the disclosure is not limited thereto. For example, in other embodiments, only one scan driving circuit may be provided.

The terminal unit 40 may be arranged on one side of the substrate 100. Preferably, the terminal unit 40 may be disposed on the side wherein there are no first scan driving circuit 20 and the second scan driving circuit 30. The terminal unit 40 may be exposed by not being covered by an insulating layer and may be electrically connected to a circuit board 90, for example, a flexible printed circuit board FPCB. A display driver 50 may be arranged on the circuit board 90. The circuit board 90 may electrically connect the display driver 50 to the terminal unit 40.

The display driver 50 may generate a control signal for controlling the driving of the first and second scan driving circuits 20 and 30, and the control signal may be transmitted to the first and second scan driving circuits 20 and 30 through a line connected to a terminal. The display driver 50 may generate a data signal, and the data signal may be transmitted to each pixel P through a fanout line 51 connected to a terminal unit 40 and the data line DL connected to the fanout line 51.

The display driver 50 may supply a driving voltage ELVDD to the driving voltage supply line 60 and may supply a common voltage ELVSS to the common voltage supply line 71. The driving voltage ELVDD may be applied to the pixels P through a driving voltage line PL connected to the driving voltage supply line 60, and the common voltage ELVSS may be applied to an opposite electrode of the display elements.

The driving voltage supply line 60 may be provided to extend in the x-direction in the peripheral area PA under the display area DA. The common voltage supply line 71 may be arranged in the peripheral area PA, may have a loop shape with one side open, and may partially surround the display area DA along the edge of the display area DA. That is, the common voltage supply line 71 may extend in both x-direction and y-direction.

A connection electrode layer 72 may overlap the common voltage supply line 71 and may extend along the common voltage supply line 71 to partially surround the display area DA. That is, like the voltage supply line 71, the connection electrode layer 72 may have a loop shape with one side open. An area in which the connection electrode layer 72 and the common voltage supply line 71 overlap each other may correspond to an electrical connection area, for example, a contact area, between the connection electrode layer 72 and the common voltage supply line 71.

The connection electrode layer 72 may electrically connect the common voltage supply line 71 to an opposite electrode (e.g., a cathode) of the organic light emitting diode of the pixel P.

Although FIG. 3 illustrates that the width of the connection electrode layer 72 is greater than the width of the common voltage supply line 71, the disclosure is not limited thereto. In other embodiments, the width of the connection electrode layer 72 may be substantially equal to the width of the common voltage supply line 71 or may be less than the width of the common voltage supply line 71.

Figure 4:
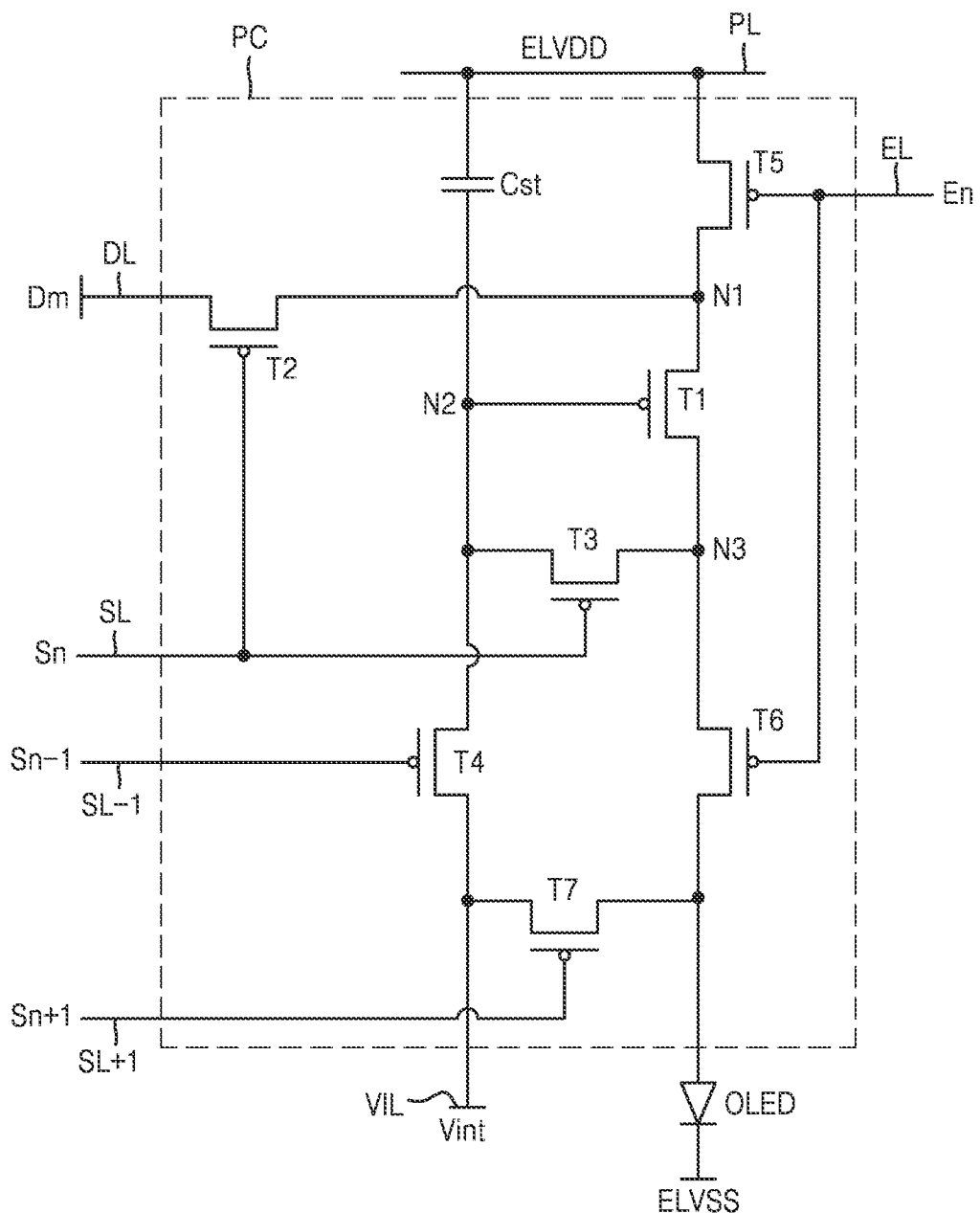
FIG. 4 is an equivalent circuit diagram of a pixel according to an embodiment.

FIG. 4 is an equivalent circuit diagram of a pixel according to an embodiment.

Referring to FIG. 4, a pixel circuit PC may be connected to a light emitting element as a display element to implement light emission of a pixel. The light emitting element may be an organic light emitting diode OLED. The pixel circuit PC may include a first transistor T1 as a driving transistor and second to seventh transistors T2, T3, T4, T5, T6, and T7 as a switching transistor. Depending on the transistor type (p-type or n-type) and/or operation condition, a first terminal of each of the first to seventh transistors T1, T2, T3, T4, T5, T6, and T7 may be a source terminal or a drain terminal and a second terminal thereof may be a terminal different from the first terminal. For example, when the first terminal is a source terminal, the second terminal may be a drain terminal. In an embodiment, the source terminal and the drain terminal may be interchangeably referred to as a source electrode and a drain electrode, respectively.

The pixel circuit PC may include a first scan line SL configured to transmit a first scan signal Sn, a second scan line SL−1 configured to transmit a second scan signal Sn−1, a third scan line SL+1 configured to transmit a third scan signal Sn+1, an emission control line EL configured to transmit an emission control signal En, a data line DL configured to transmit a data signal Dm, a driving voltage line PL configured to transmit a driving voltage ELVDD, and an initialization voltage line VIL configured to transmit an initialization voltage Vint.

The first transistor T1 may be connected between the driving voltage line PL and the organic light emitting diode OLED. The first transistor T1 may be connected to the driving voltage line PL via the fifth transistor T5 and may be electrically connected to the organic light emitting diode OLED via the sixth transistor T6. The first transistor T1 may include a gate terminal connected to a second node N2, a first terminal connected to a first node N1, and a second terminal connected to a third node N3. The first transistor T1 may function as a driving transistor and may receive the data signal Dm according to a switching operation of the second transistor T2 to supply a driving current to the light emitting element.

The second transistor T2 (a data write transistor) may be connected between the data line DL and the first node N1 and may be connected to the driving voltage line PL via the fifth transistor T5. The first node N1 may be a node to which the first transistor T1 and the fifth transistor T5 are connected. The second transistor T2 may include a gate terminal connected to the first scan line SL, a first terminal connected to the data line DL, and a second terminal connected to the first node N1 (or the first terminal of the first transistor T1). The second transistor T2 may be turned on according to the first scan signal Sn received through the first scan line SL, to perform a switching operation of transmitting the data signal Dm transmitted to the data line DL to the first node N1.

The third transistor T3 (a compensation transistor) may be connected between the second node N2 and the third node N3. The third transistor T3 may be connected to the organic light emitting diode OLED via the sixth transistor T6. The second node N2 may be a node to which the gate electrode of the first transistor T1 is connected, and the third node N3 may be a node to which the first transistor T1 and the sixth transistor T6 are connected. The third transistor T3 may include a gate terminal connected to the first scan line SL, a first terminal connected to the second node N2 (or the gate terminal of the first transistor T1), and a second terminal connected to the third node N3 (or the second terminal of the first transistor T1). The third transistor T3 may be turned on according to the first scan signal Sn received through the first scan line SL to diode-connect the first transistor T1 to compensate for the threshold voltage of the first transistor T1. The third transistor T3 may have a structure in which two or more transistors are connected in series.

The fourth transistor T4 (a first initialization transistor) may be connected between the second node N2 and the initialization voltage line VIL. The fourth transistor T4 may include a gate terminal connected to the second scan line SL−1, a first terminal connected to the second node N2, and a second terminal connected to the initialization voltage line VIL. The fourth transistor T4 may be turned on according to the second scan signal Sn−1 received through the second scan line SL−1 to transmit the initialization voltage Vint to the gate terminal of the first transistor T1 to initialize the gate voltage of the first transistor T1. The fourth transistor T4 may have a structure in which two or more transistors are connected in series.

The fifth transistor T5 (a first emission control transistor) may be connected between the driving voltage line PL and the first node N1. The sixth transistor T6 (a second emission control transistor) may be connected between the third node N3 and the organic light emitting diode OLED. The fifth transistor T5 may include a gate terminal connected to the emission control line EL, a first terminal connected to the driving voltage line PL, and a second terminal connected to the first node N1. The sixth transistor T6 may include a gate terminal connected to the emission control line EL, a first terminal connected to the third node N3, and a second terminal connected to the pixel electrode of the organic light emitting diode OLED. The fifth transistor T5 and the sixth transistor T6 may be simultaneously turned on according to the emission control signal En received through the emission control line EL and thus a driving current may flow through the organic light emitting diode OLED.

The seventh transistor T7 (a second initialization transistor) may be connected between the organic light emitting diode OLED and the initialization voltage line VIL. The seventh transistor T7 may include a gate terminal connected to the third scan line SL+1, a first terminal connected to the second terminal of the sixth transistor T6 and the pixel electrode of the organic light emitting diode OLED, and a second terminal connected to the initialization voltage line VIL. The seventh transistor T7 may be turned on according to the third scan signal Sn+1 received through the third scan line SL+1 to transmit the initialization voltage Vint to the pixel electrode of the organic light emitting diode OLED to initialize the voltage of the pixel electrode of the organic light emitting diode OLED. The seventh transistor T7 may be omitted.

A capacitor Cst may include a first electrode connected to the second node N2 and a second electrode connected to the driving voltage line PL. The capacitor Cst may be configured to maintain a voltage applied to the gate electrode of the first transistor T1 by storing and maintaining a voltage corresponding to the difference between the voltages respectively supplied to both ends of the first electrode and the second electrode.

The organic light emitting diode OLED may include the pixel electrode (e.g., an anode) and the opposite electrode (e.g., a cathode) facing the pixel electrode, and the opposite electrode may receive the common voltage ELVSS. The organic light emitting diode OLED may receive a driving current corresponding to a voltage value stored in the capacitor Cst from the first transistor T1 to emit light in a certain color to display an image. The opposite electrode may be commonly, that is, integrally, provided to a plurality of pixels.

In FIG. 4, P-type transistors are illustrated as the transistors of the pixel circuit. However, the present embodiments are not limited thereto. For example, according to various embodiments, the transistors of the pixel circuit may be N-type transistors, or some may be P-type transistors, and others may be N-type transistors.

Figure 5:
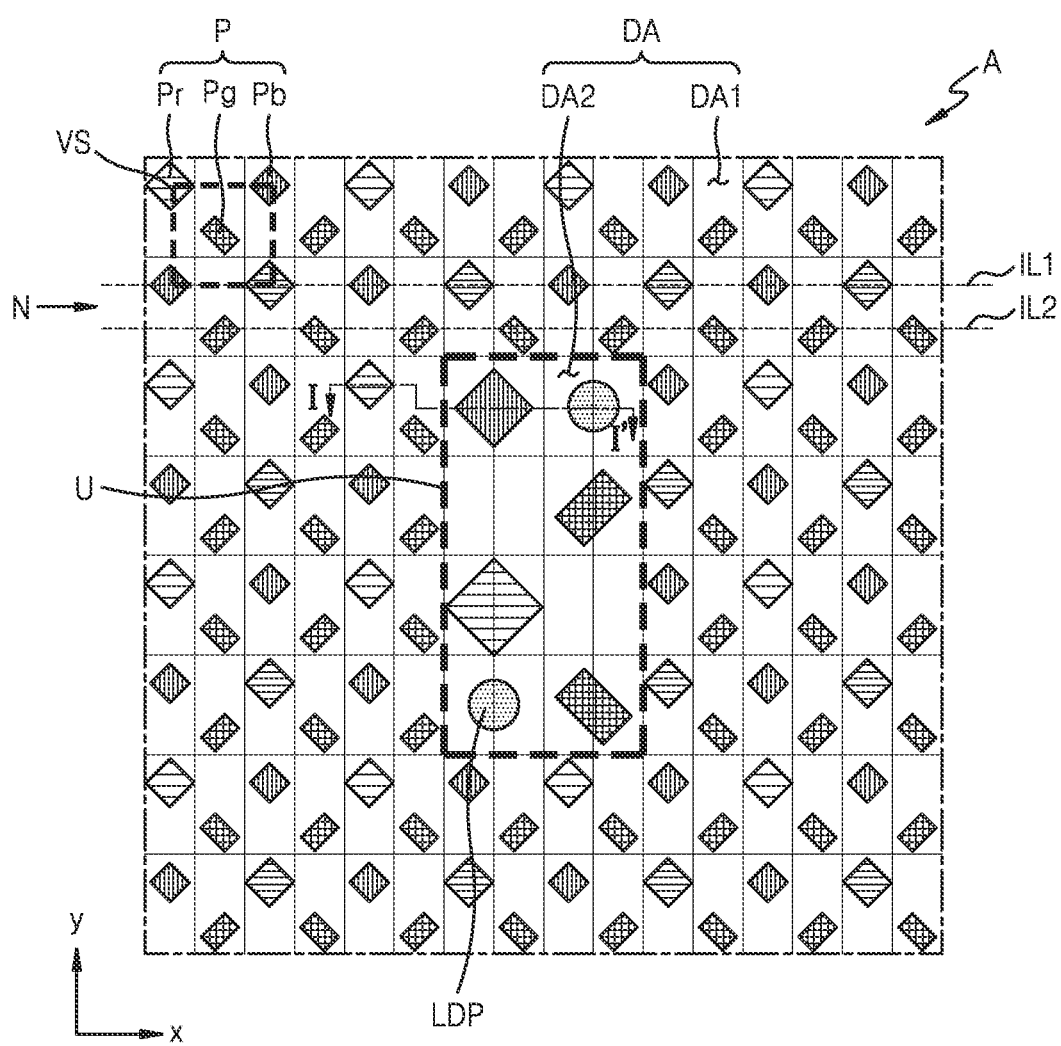
FIG. 5 is a diagram schematically illustrating a portion of a display area illustrated in FIG. 3.
Figure 6:
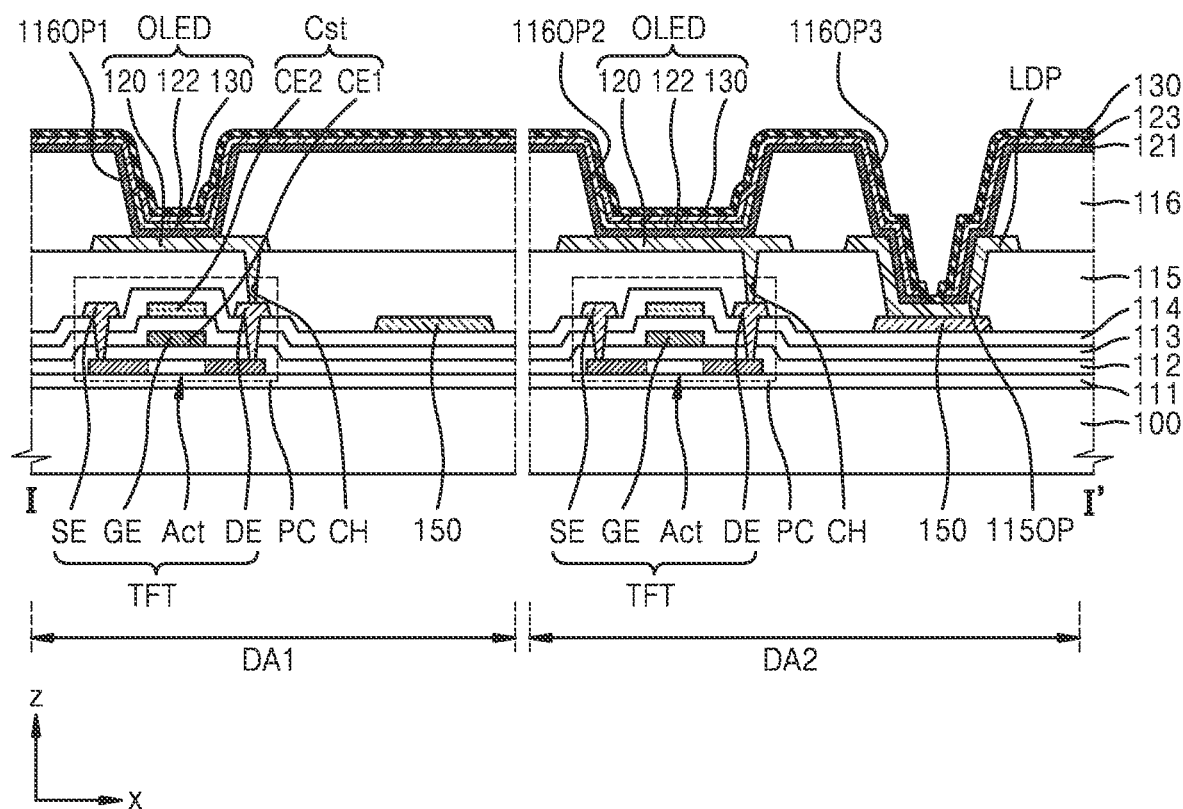
FIG. 6 is a cross-sectional view of the display area taken along line I-I' of FIG. 5.
Figure 7:
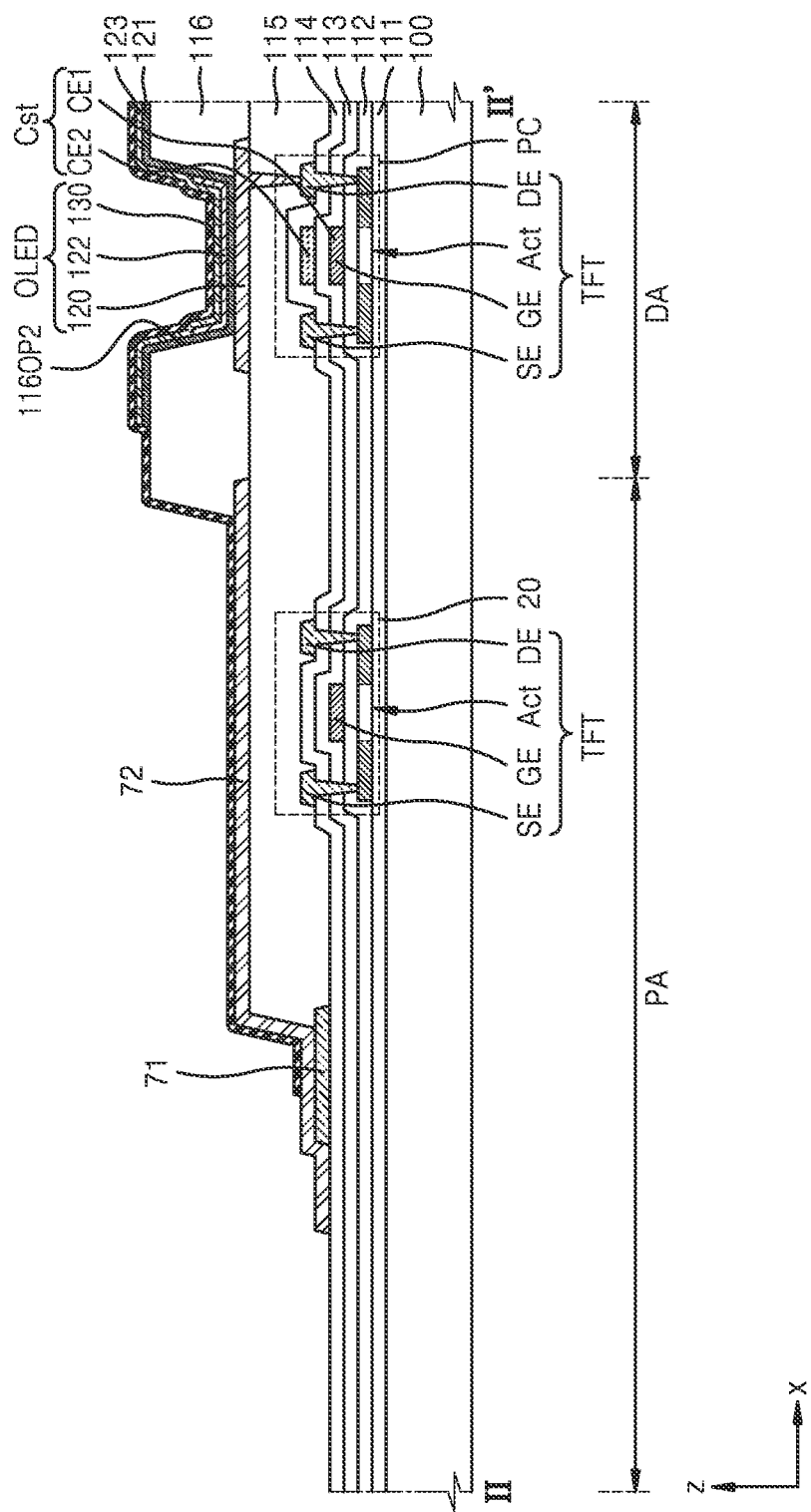
FIG. 7 is a cross-sectional view of the display panel taken along line II-II' of FIG. 3.

FIG. 5 is a diagram schematically illustrating a portion of a display area illustrated in FIG. 3. FIG. 6 is a cross-sectional view of the display area taken along line I-I' of FIG. 5. FIG. 7 is a cross-sectional view of the display panel taken along line II-II' of FIG. 3. FIGS. 8A, 8B, 8C, 8D, 8E, and 8F are diagrams describing a process of manufacturing a display apparatus mainly with respect to a second display area of FIG. 6. FIGS. 9A, 9B, and 9C are diagrams schematically illustrating the arrangement of auxiliary lines according to an embodiment.

Referring to FIG. 5, pixels P may be arranged in the first display area DA1 and the second display area DA2, and the pixels P may include first to third pixels emitting light of different colors. Hereinafter, for convenience of description, it will be assumed that the first pixel is a red pixel Pr, the second pixel is a green pixel Pg, and the third pixel is a blue pixel Pb.

The red pixels Pr, the green pixels Pg, and the blue pixels Pb may be arranged in the first display area DA1 and the second display area DA2 according to a certain rule.

In each row N, the red pixels Pr, the green pixels Pg, and the blue pixels Pb may be alternately arranged apart from each other. In each row N, the red pixels Pr and the blue pixels Pb may be alternately arranged apart from each other along a first virtual line IL1, and the green pixels Pg may be arranged apart from each other along a second virtual line IL2. This arrangement of pixels may be repeated up to the last row. In this case, the size (or area) of the blue pixel Pb and the red pixel Pr may be greater than the size (or area) of the green pixel Pg.

The red pixels Pr and the blue pixels Pb arranged along the first virtual line IL1 and the green pixels Pg arranged along the second virtual line IL2 may be alternately arranged. Thus, a column in which the red pixels Pr and the blue pixel Pb are alternately arranged and a column in which the green pixels Pg are arranged apart from each other by a certain distance may be alternately repeated up to the last column.

When this pixel arrangement structure is expressed differently, it may be stated that the red pixels Pr are arranged at the first and third corners facing each other among the corners of a virtual square VS having a center of the green pixel Pg as a center thereof and the blue pixels Pb are arranged at the second and fourth corners that are the other corners thereof. In this case, the virtual square VS may be variously modified into a rectangle, a rhombus, a square, or the like.

Such a pixel arrangement structure may be referred to as a pentile (PenTile™) structure, and high resolution may be implemented by a small number of pixels by applying a rendering drive that represents colors by sharing adjacent pixels.

Herein, the pixel may refer to an emission area as a minimum unit for implementing an image. When an organic light emitting diode is used as a display element, an emission area of the pixel may be defined by an emission layer or an opening of a pixel definition layer.

The red pixel Pr, the green pixel Pg, and the blue pixel Pb illustrated in FIG. 5 may respectively emit red, green, and blue light by using light emitting diodes. Thus, the arrangement of pixels may correspond to the arrangement of organic light emitting diodes as display elements. For example, the position of the red pixel Pr illustrated in FIG. 5 may represent the position of the organic light emitting diode emitting red light. Likewise, the position of the green pixel Pg may represent the position of the organic light emitting diode emitting green light, and the position of the blue pixel Pb may represent the position of the organic light emitting diode emitting blue light.

In an embodiment, the pixel arrangement structures of the first display area DA1 and the second display area DA2 may be equal to each other. The resolutions of the first display area DA1 and the second display area DA2 may be different from each other. For example, the resolution of the first display area DA1 may be higher than the resolution of the second display area DA2.

The size (area) of the organic light emitting diode or the size (area) of the emission area or the size (area) of the pixel electrode in the second display area DA2 may be greater than the size (area) of the organic light emitting diode emitting light of a corresponding color or the size (area) of the emission area or the size (area) of the pixel electrode in the first display area DA1. For example, the size of the organic light emitting diode, the size of the emission area, or the size of the pixel electrode in the red pixel Pr of the second display area DA2 may be greater than the size of the organic light emitting diode, the size of the emission area, or the size of the pixel electrode in the red pixel Pr of the first display area DA1.

At least one basic unit U including a certain number of pixels may be included in the second display area DA2. The basic unit U may be repeatedly arranged in the x-direction and/or the y-direction. The basic unit U may have a shape in which a certain number of pixels are grouped in a square shape according to the pixel arrangement structure. The basic unit U may be a division of the repeated form and may not mean a disconnection of the configuration. FIG. 5 illustrates an example in which one basic unit U including a total of four pixels including one red pixel Pr, one blue pixel Pb, and two green pixels Pg according to the pentile structure is arranged in the second display area DA2.

The pixel circuit structure to which the organic light emitting diode of the pixel P arranged in the first display area DA1 is connected may be equal to the pixel circuit structure to which the organic light emitting diode of the pixel P arranged in the second display area DA2 is connected. The size of the transistor and the size (capacity) of the capacitor in the pixel circuit of the pixel P arranged in the first display area DA1 may be different from the size of the transistor and the size (capacity) of the capacitor in the pixel circuit of the pixel P arranged in the second display area DA2. For example, the size of the transistor and the size (capacity) of the capacitor in the pixel circuit of the pixel P arranged in the second display area DA2 may be adjusted such that the luminance of the second display area DA2 having low resolution may be similar to the luminance of the first display area DA1.

At least one conductive pattern LDP may be provided in the second display area DA2. The conductive pattern LDP may be provided between adjacent pixels P, which is, between the organic light emitting diodes, and may not overlap each of the organic light emitting diodes. The conductive pattern LDP may be provided in an area where circuit elements and/or lines constituting the pixel circuit are not arranged or in an area where the arrangement of circuit elements and/or lines is minimal. The conductive pattern LDP may be formed of the same material on the same layer as the pixel electrode of the organic light emitting diode. The conductive pattern LDP may contact the opposite electrode of the organic light emitting diode to be electrically connected to the opposite electrode.

The organic light emitting diode of each of the pixels P may be arranged on the upper layer of the corresponding pixel circuit. The organic light emitting diode may be arranged directly over a pixel circuit to overlap the pixel circuit or may be arranged to partially overlap the pixel circuit of another pixel P arranged in an adjacent row or column offset from the pixel circuit.

Hereinafter, a stack structure of components according to the cross-sectional views of FIGS. 6 and 7 will be described with reference to FIGS. 8A, 8B, 8C, 8D, 8E, and 8F. FIG. 6 is a cross-sectional view of the first display area DA1 and the second display area DA2. FIG. 7 is a cross-sectional view of the peripheral area PA and the display area DA.

Referring to FIGS. 6 and 8A, 8B, 8C, 8D, 8E, and 8F, an organic light emitting diode OLED may be formed in each of the first display area DA1 and the second display area DA2 over the substrate 100.

The substrate 100 may include an insulating material such as glass, quartz, or polymer resin. The substrate 100 may include a rigid substrate or a flexible substrate capable of bending, folding, rolling, or the like.

A buffer layer 111 may be arranged on the substrate 100. The buffer layer 111 may reduce or block the penetration of foreign materials, moisture, or external air from the bottom of the substrate 100. The buffer layer 111 may include an inorganic insulating material such as silicon oxide, silicon oxynitride, or silicon nitride and may be formed in a single-layer or multilayer structure including the above material.

Figure 8A:
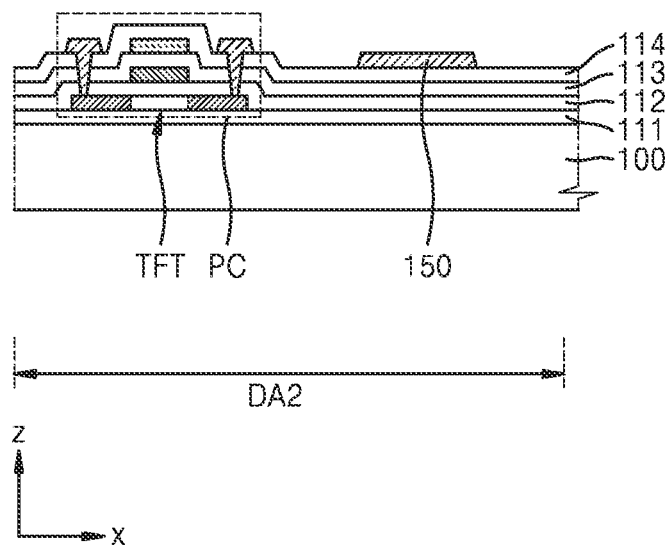
FIGS. 8A, 8B, 8C, 8D, 8E, and 8F are diagrams describing a process of manufacturing a display apparatus mainly with respect to a second display area of FIG. 6.
Figure 9A:
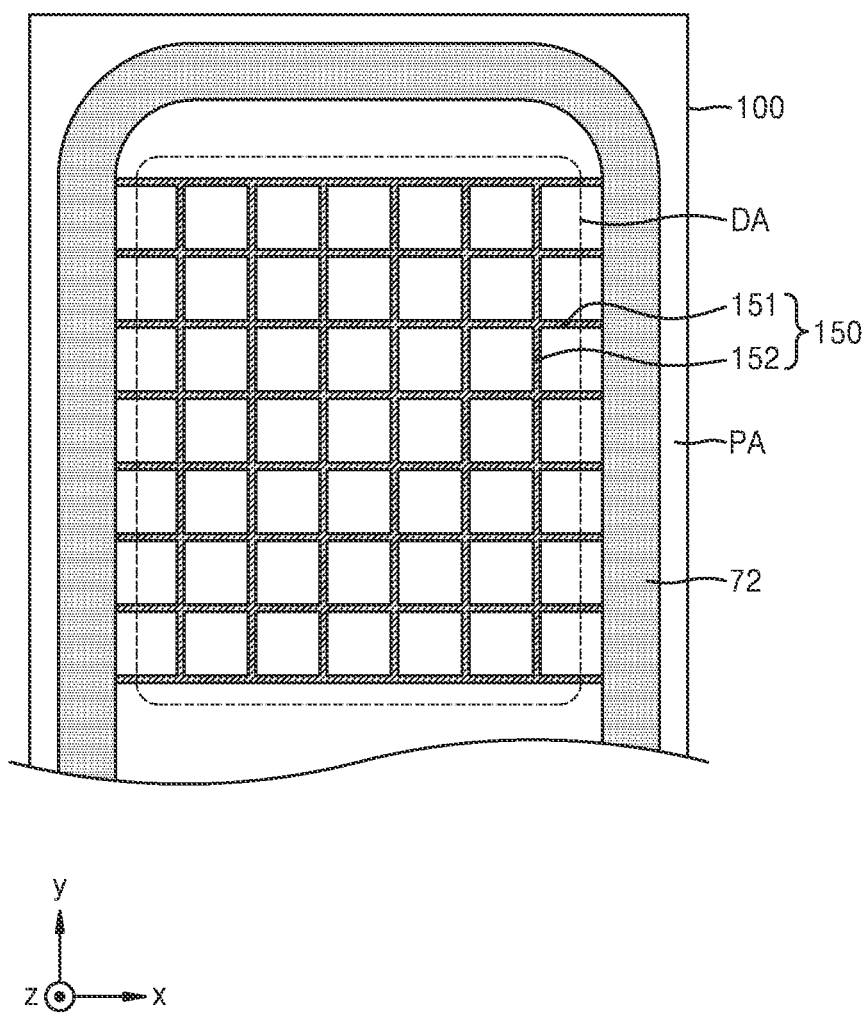
FIGS. 9A, 9B, and 9C are diagrams schematically illustrating the arrangement of auxiliary lines according to an embodiment.
Figure 9B:
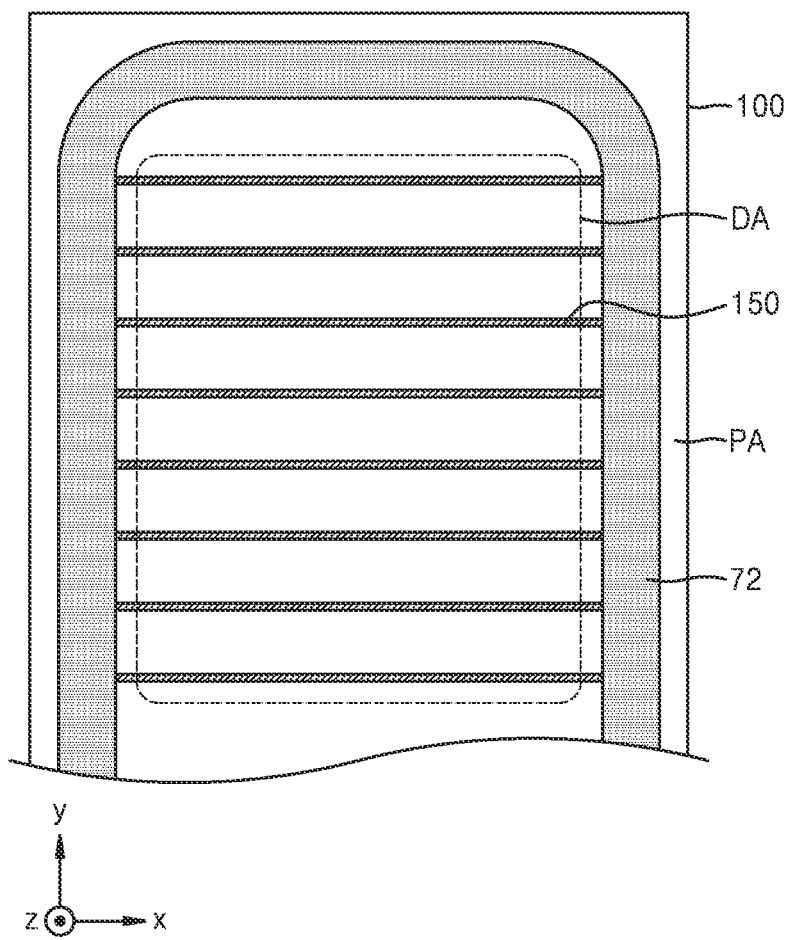
Figure 9C:
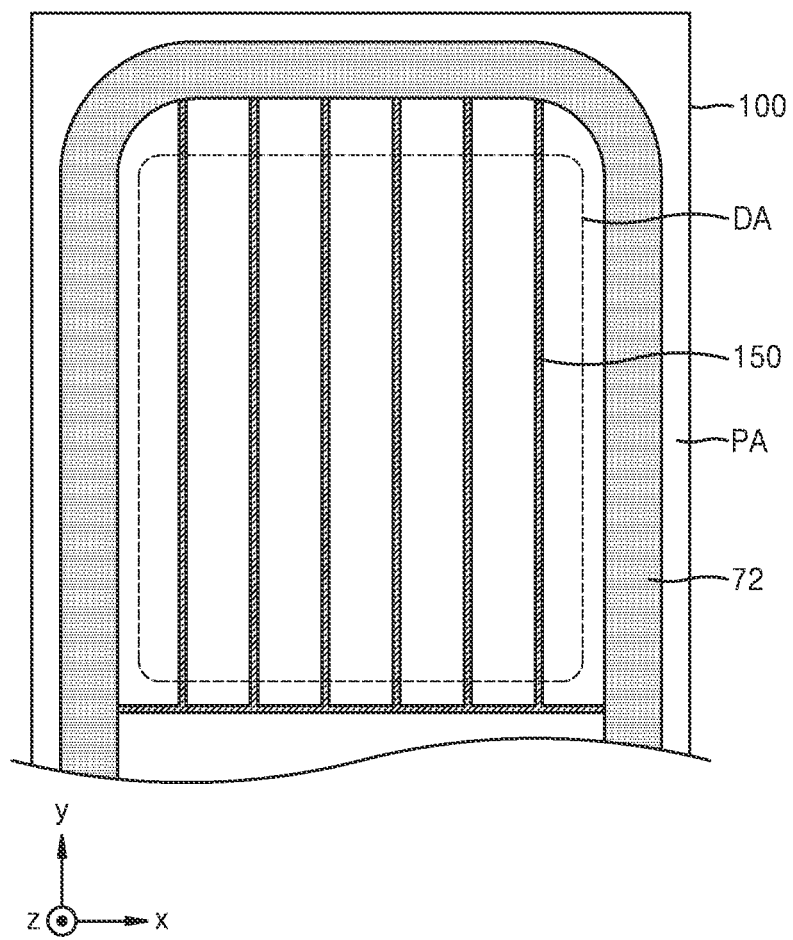

As illustrated in FIG. 8A, a pixel circuit PC and an auxiliary electrode layer 150 may be formed on the buffer layer 111.

The organic light emitting diode OLED may be electrically connected to the pixel circuit PC.

The pixel circuit PC may include a thin film transistor TFT, a capacitor Cst, and a plurality of lines connected thereto. The thin film transistor TFT may include a semiconductor layer Act, a gate electrode GE overlapping a channel area of the semiconductor layer Act, and a source electrode SE and a drain electrode DE respectively connected to a source area and a drain area of the semiconductor layer Act. A first gate insulating layer 112 may be arranged between the semiconductor layer Act and the gate electrode GE. A second gate insulating layer 113 and an interlayer insulating layer 114 may be arranged between the gate electrode GE and the source electrode SE (or the drain electrode DE). An interlayer insulating layer 114 may be arranged on second gate insulating layer 113. A planarization layer 115 may be arranged on the source electrode SE and the drain electrode DE.

The semiconductor layer Act may include polysilicon. In some embodiments, the semiconductor layer Act may include amorphous silicon. In some embodiments, the semiconductor layer Act may include an oxide semiconductor of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer Act may include a channel area and a source area and a drain area that are doped with dopants.

The capacitor Cst may be arranged to overlap the thin film transistor TFT. The capacitor Cst may include a lower electrode CE1 and an upper electrode CE2 overlapping each other. In some embodiments, the gate electrode GE of the thin film transistor TFT may include the lower electrode CE1 of the capacitor Cst.

The gate electrode GE or the lower electrode CE1 may include a low-resistance conductive material such as molybdenum (Mo), aluminum (Al), copper (Cu), and/or titanium (Ti) and may have a single-layer or multilayer structure including the above material.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may have a single-layer or multilayer structure including the above material. The interlayer insulating layer 114 may be arranged between the lower electrode CE1 and the upper electrode CE2.

The source electrode SE and/or the drain electrode DE may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may have a single-layer or multilayer structure including the above material. For example, the source electrode SE and/or the drain electrode DE may have a three-layer structure of titanium layer/aluminum layer/titanium layer.

Each of the first gate insulating layer 112, the second gate insulating layer 113, and the interlayer insulating layer 114 may include an inorganic insulating material such as silicon oxide, silicon oxynitride, or silicon nitride and may have a single-layer or multilayer structure including the above material.

The auxiliary electrode layer 150 may be formed on the same layer as the source electrode SE and/or the drain electrode DE in the first display area DA1 and second display area DA2. In an embodiment, the auxiliary electrode layer 150 may be arranged in a grid structure in the first display area DA1 and the second display area DA2 as illustrated in FIG. 9A. The auxiliary electrode layer 150 may include horizontal lines 151 extending in the x-direction and spaced apart from each other by a certain distance and vertical lines 152 extending in the y-direction and spaced apart from each other by a certain distance. The horizontal lines 151 may be arranged in units of rows or may be arranged at intervals of a plurality of rows. The vertical lines 152 may be arranged in units of columns or may be arranged at intervals of a plurality of columns. The horizontal lines 151 and the vertical lines 152 may be integrally formed. The auxiliary electrode layer 150 may be electrically connected to the connection electrode layer 72 in the peripheral area PA. In other embodiments, the auxiliary electrode layer 150 may include only horizontal lines as illustrated in FIG. 9B or may include only vertical lines as illustrated in FIG. 9C.

In FIGS. 9A, 9B, and 9C, the auxiliary electrode layer 150 is illustrated as a straight line. However, this is merely an example and the auxiliary electrode layer 150 may extend in a zigzag manner and may have a curvature not to overlap the display element or the pixel electrode depending on the pixel arrangement.

In FIGS. 9A, 9B, and 9C, the auxiliary electrode layer 150 is electrically connected to the connection electrode layer 72. However, this is merely an example and the auxiliary electrode layer 150 may be electrically connected to the common voltage supply line 71.

Figure 8B:
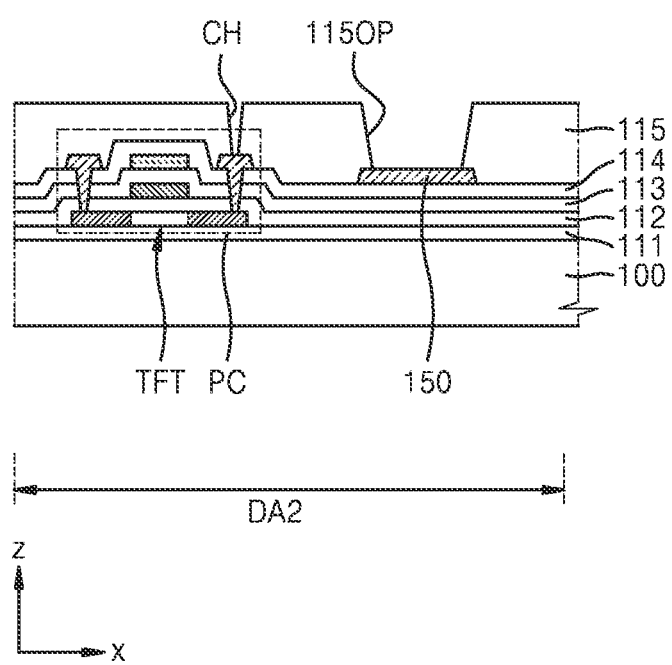

As illustrated in FIG. 8B, a planarization layer 115 may be arranged on the interlayer insulating layer 114. The planarization layer 115 may include an organic material such as acryl, benzocyclobutene (BCB), polyimide, or hexamethyldisiloxane (HMDSO). Alternatively, the planarization layer 115 may include an inorganic material. The planarization layer 115 may function as a protection layer covering the first to seventh transistors T1, T2, T3, T4, T5, T6, and T7, and an upper portion of the planarization layer 115 may be planarized. The planarization layer 115 may include a single layer or multiple layers.

A plurality of lines may be arranged between the first gate insulating layer 112, the second gate insulating layer 113, the interlayer insulating layer 114, and the planarization layer 115. The plurality of lines may include a data line, a scan line, an emission control line, and the like connected to the thin film transistor TFT and the capacitor Cst.

A contact hole CH for connecting the pixel circuit PC to a pixel electrode 120 of the organic light emitting diode OLED may be formed in the planarization layer 115 of the first display area DA1 and the second display area DA2. The contact hole CH of the planarization layer 115 may expose a portion of the source electrode SE or the drain electrode DE of the thin film transistor TFT. In FIG. 6, the contact hole CH exposes a portion of the drain electrode DE of the thin film transistor TFT. An opening 115OP exposing a portion of the auxiliary electrode layer 150 may be further formed in the planarization layer 115 of the second display area DA2.

The organic light emitting diode OLED may include an overlap structure of a first electrode 120 as a pixel electrode, an emission layer 122, and a second electrode 130 as an opposite electrode. The above overlap structure may further include a first functional layer 121 provided between the first electrode 120 and the emission layer 122 and/or a second functional layer 123 provided between the emission layer 122 and the second electrode 130.

The first electrode 120 may be provided on the planarization layer 115 of the first display area DA1 and the second display area DA2. The first electrode 120 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. The first electrode 120 may include a reflective layer including the above material, and a transparent conductive layer arranged over and/or under the reflective layer. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). In an embodiment, the first electrode 120 may include a three-layer structure of ITO layer/Ag layer/ITO layer.

The first electrode 120 may contact the drain electrode DE of the thin film transistor TFT through the contact hole CH to be electrically connected to the pixel circuit PC including the thin film transistor TFT.

Figure 8C:
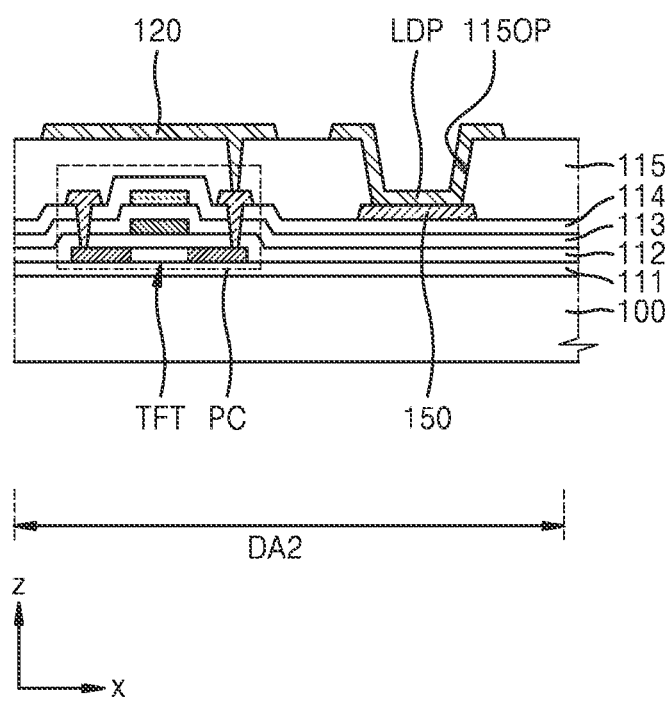

As illustrated in FIG. 8C, a conductive pattern LDP may be further provided on the planarization layer 115 in the second display area DA2. A portion of the conductive pattern LDP may be provided in the opening 115OP of the planarization layer 115 to contact the auxiliary electrode layer 150 in a portion of an area overlapping the auxiliary electrode layer 150 to be electrically connected to the auxiliary electrode layer 150. The conductive pattern LDP may be formed together with the first electrode 120 by patterning a conductive layer for forming the first electrode 120 in the process of forming the first electrode 120. Accordingly, the conductive pattern LDP may include the same material as the first electrode 120.

The conductive pattern LDP may not be formed in the first display area DA1, and accordingly, an opening exposing the auxiliary electrode layer 150 may not be formed in the planarization layer 115 of the first display area DA1.

Figure 8D:
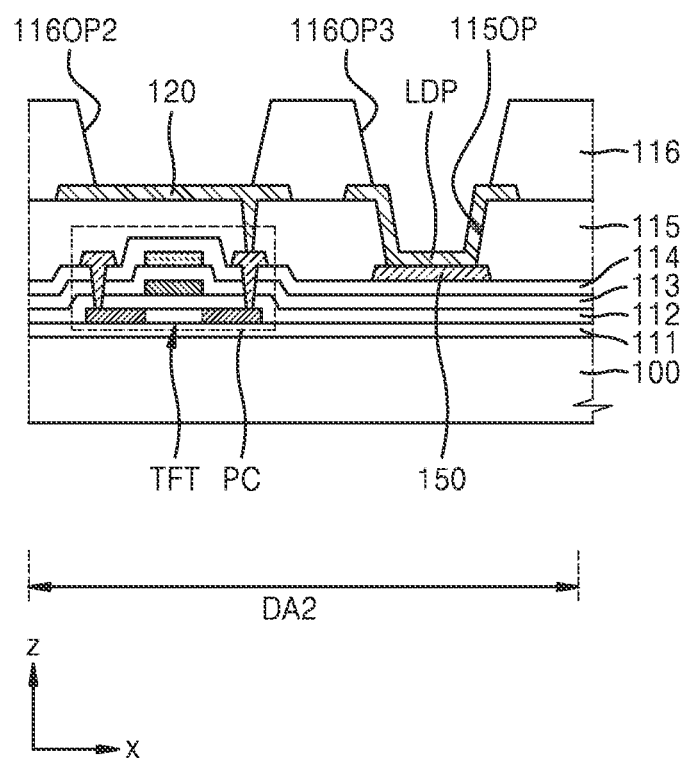

A pixel definition layer 116 may be arranged on the first electrode 120, and an opening covering the edge of the first electrode 120 and corresponding to the first electrode 120 and an opening corresponding to the conductive pattern LDP may be formed in the pixel definition layer 116. FIGS. 6 and 8D illustrate a first opening 116OP1 corresponding to the first electrode 120 of the organic light emitting diode OLED of the first display area DA1, a second opening 116OP2 corresponding to the first electrode 120 of the organic light emitting diode OLED of the second display area DA2, and a third opening 116OP3 corresponding to the conductive pattern LDP of the second display area DA2, in the pixel definition layer 116. The third opening 116OP3 of the pixel definition layer 116 may overlap the opening 115OP of the planarization layer 115.

The first opening 116OP1 and the second opening 116OP2 of the pixel definition layer 116 may respectively define the emission areas of the organic light emitting diode OLED of the first display area DA1 and the second display area DA2. For example, the width of the first opening 116OP1 of the pixel definition layer 116 may correspond to the width of the emission area of the organic light emitting diode of the first display area DA1, and the width of the second opening 116OP2 of the pixel definition layer 116 may correspond to the width of the organic light emitting diode OLED of the second display area DA2. The pixel definition layer 116 may be formed of, for example, an organic material such as polyimide or hexamethyldisiloxane (HMDSO).

The emission layer 122 may be located corresponding to each of the first opening 116OP1 and the second opening 116OP2 of the pixel definition layer 116 and may overlap the first electrode 120. The emission layer 122 may include a high-molecular or low-molecular weight organic material for emitting light of a certain color. A first functional layer 121 and a second functional layer 123 may be formed under and over the emission layer 122.

The first functional layer 121 may include a hole transport layer (HTL, not shown) and/or a hole injection layer (HIL, not shown). The second functional layer 123 may include an electron transport layer (ETL, not shown) and/or an electron injection layer (EIL, not shown). Unlike the emission layer 122, the first functional layer 121 and/or the second functional layer 123 may be entirely formed on the substrate 100. That is, the first functional layer 121 and/or the second functional layer 123 may cover the first display area DA1 and the second display area DA2. The first functional layer 121 and/or the second functional layer 123 may cover the first, second, and third openings 116OP1, 116OP2, and 116OP3 of the pixel definition layer 116. That is, the emission layer 122 may overlap the first and second openings 116OP1 and 116OP2, but not the third opening 116OP3.

Figure 8E:
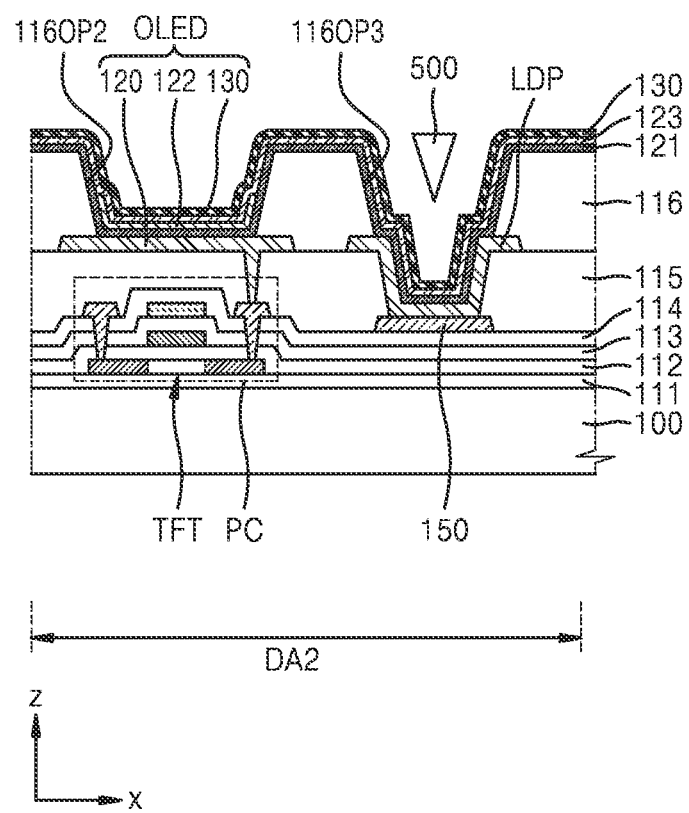

As illustrated in FIG. 8E, a part of the first functional layer 121 and/or the second functional layer 123 in the third opening 116OP3 may be removed by a drilling process using a laser light source 500. As the first functional layer 121 and/or the second functional layer 123 is removed in the third opening 116OP3, a portion of the conductive pattern LDP may be exposed. The laser light source 500 may be irradiated to an area corresponding to a portion of the conductive pattern LDP.

Figure 8F:
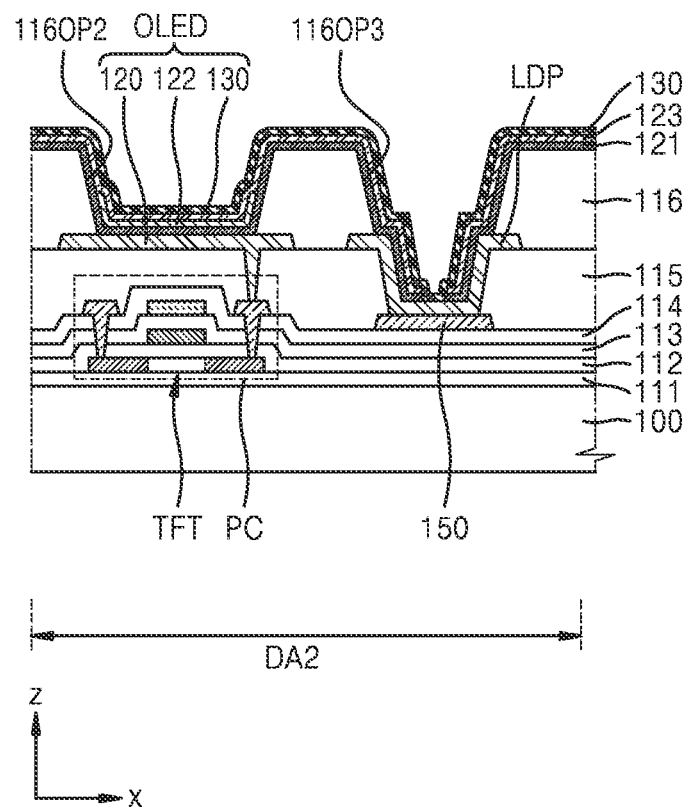

As illustrated in FIG. 8F, the second electrode 130 may be arranged over the display area DA and may be arranged to cover the display area DA. That is, the second electrode 130 may be integrally formed to cover a plurality of pixels. The second electrode 130 may cover the third opening 116OP3 of the pixel definition layer 116 and may contact the conductive pattern LDP in an area in the third opening 116OP3 where the first functional layer 121 and/or the second functional layer 123 is removed. Accordingly, the second electrode 130 may be electrically connected to the auxiliary electrode layer 150 through the conductive pattern LDP.

Moreover, as illustrated in FIG. 7, an inorganic insulating layer may be arranged in the peripheral area PA, and the inorganic insulating layer may include at least one of the buffer layer 111, the first gate insulating layer 112, the second gate insulating layer 113, and the interlayer insulating layer 114 described above. A common voltage supply line 71 may be arranged on the inorganic insulating layer. A connection electrode layer 72 may be arranged on the planarization layer 115.

The common voltage supply line 71 may include the same material as the source electrode SE and/or the drain electrode DE. The connection electrode layer 72 may be insulated from the first electrode 120 and may contact a portion of the upper surface of the common voltage supply line 71. The connection electrode layer 72 may cover the upper portion of the planarization layer 115. In an embodiment, the connection electrode layer 72 may be formed together with the first electrode 120 by patterning a conductive layer for forming the first electrode 120 in the process of forming the first electrode 120. Accordingly, the connection electrode layer 72 may include the same material as the first electrode 120. In an embodiment, the connection electrode layer 72 may include ITO/Ag/ITO. In other embodiments, the connection electrode layer 72 may be formed by a conductive layer separate from the conductive layer forming the first electrode 120. The connection electrode layer 72 may overlap the first and second scan driving circuits 20 and 30.

The second electrode 130 extending from the display area DA to the peripheral area PA may directly contact the upper surface of the connection electrode layer 72. Accordingly, the second electrode 130 may receive the common voltage ELVSS applied from the common voltage supply line 71 through the connection electrode layer 72. Also, the second electrode 130 may be electrically connected to the auxiliary electrode layer 150 in the second display area DA2, and the auxiliary electrode layer 150 may be electrically connected to the connection electrode layer 72 as illustrated in FIGS. 9A, 9B, and 9C to receive the common voltage ELVSS.

The second electrode 130 may be configured to supply a certain electrical signal, that is, the common voltage ELVSS, in a plurality of pixels. In order to implement a display apparatus providing a high-quality image, it may be necessary to prevent a voltage drop or the like from occurring in the second electrode 130. According to embodiments, the voltage drop of the common voltage ELVSS supplied to the second electrode 130 may be prevented or minimized through the above structure, and thus, the power consumption of the display apparatus may be reduced.

Although not illustrated, an encapsulation layer may be provided to cover the organic light emitting diode OLED. The encapsulation layer may prevent damage by external moisture or oxygen. The encapsulation layer may cover the display area DA and extend to the outside of the display area DA. The encapsulation layer may include at least one inorganic encapsulation layer and at least one organic encapsulation layer. In an embodiment, the encapsulation layer may have a stack structure of a first inorganic encapsulation layer/an organic encapsulation layer/a second inorganic encapsulation layer.

Figure 10:
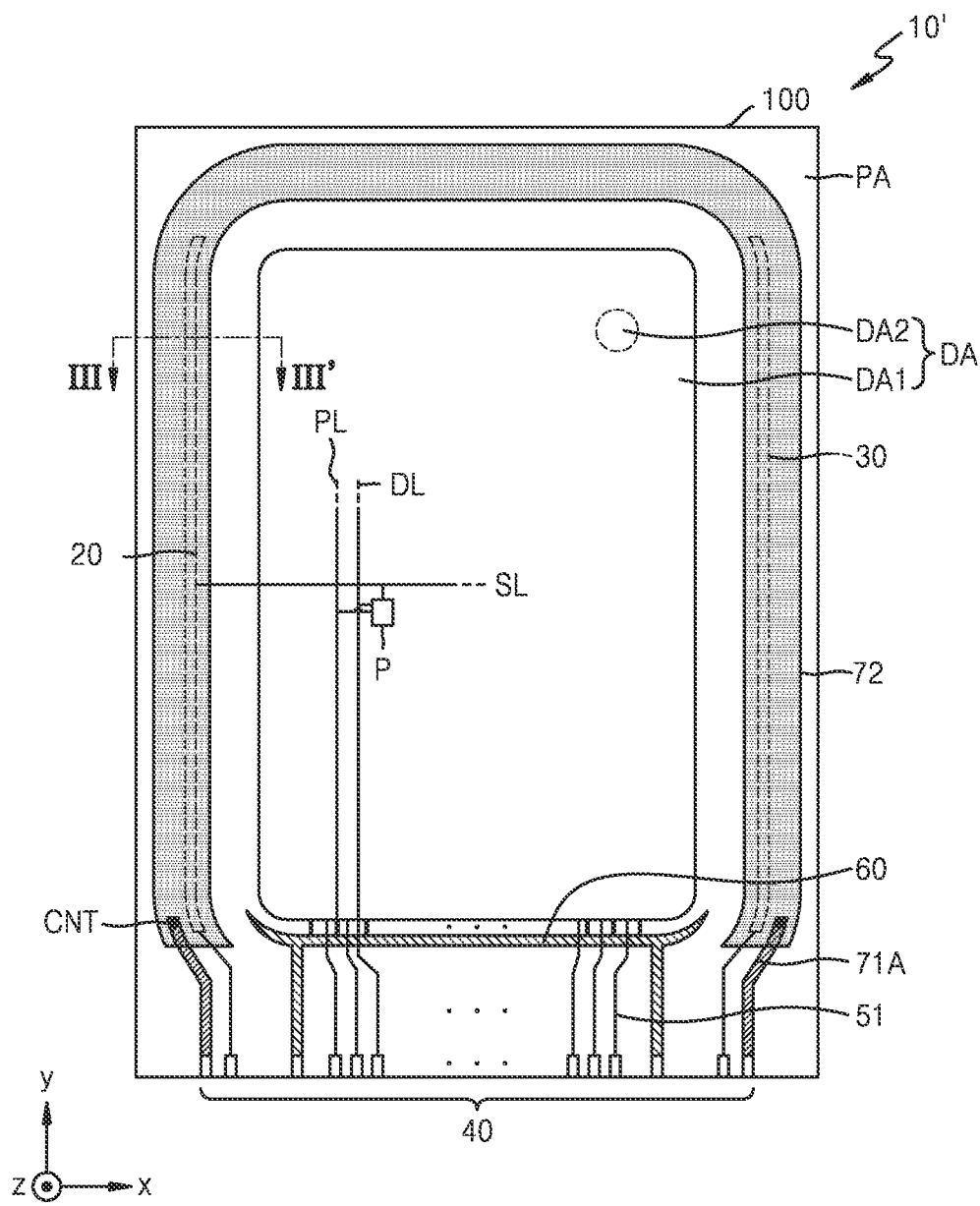
FIG. 10 is a plan view schematically illustrating a display panel according to an embodiment.
Figure 10:
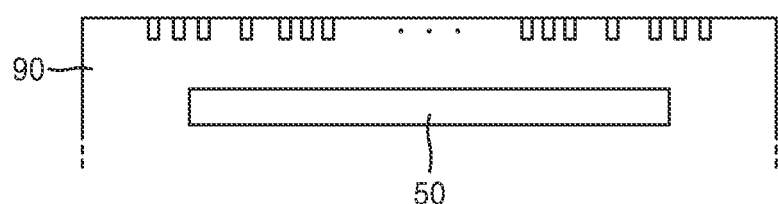
Figure 11:
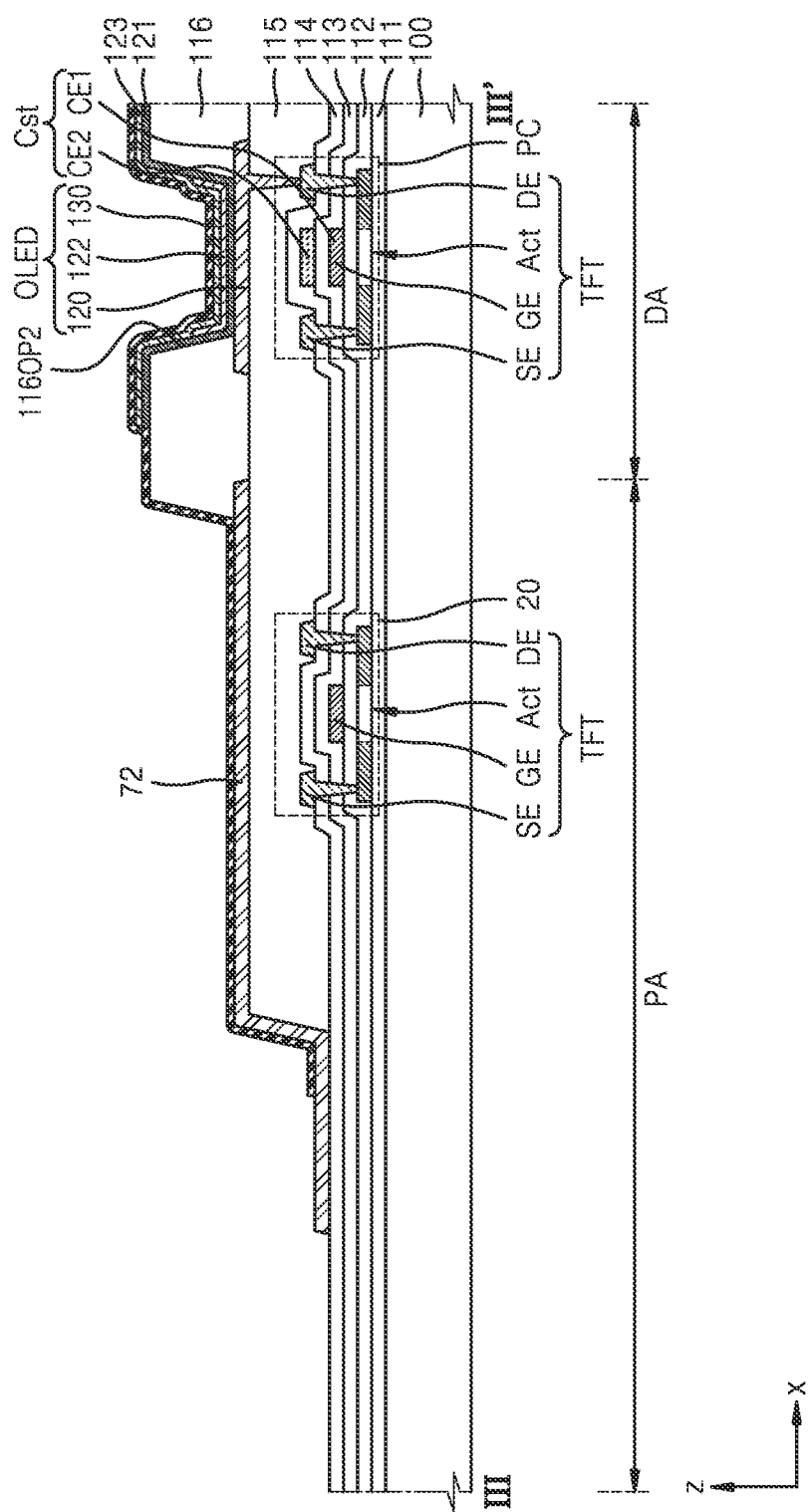
FIG. 11 is a cross-sectional view of the display panel taken along line III-III' of FIG. 10.

FIG. 10 is a plan view schematically illustrating a display panel according to an embodiment. FIG. 11 is a cross-sectional view of the display panel taken along line III-III' of FIG. 10.

Except for the structure of a common voltage supply line 71A of a display panel 10' illustrated in FIGS. 10 and 11, other configurations may be the same as those of the display apparatus described above with reference to FIGS. 3, 4, 5, 6, 7, 8A, 8B, 8C, 8D, 8E, 8F, 9A, 9B, and 9C, and therefore, the difference of the common voltage supply line 71A will be mainly described.

The common voltage supply line 71A may be provided in the peripheral area PA close to the terminal unit 40, and a portion of the common voltage supply line 71A may overlap the connection electrode layer 72. Unlike the common voltage supply line 71 described with reference to FIG. 3, the common voltage supply line 71A of FIG. 10 may not surround the display area DA. The common voltage supply line 71A may be electrically connected to an end portion of the connection electrode layer 72 through a contact hole provided in at least one insulating layer arranged therebetween. The connection electrode layer 72 may contact the opposite electrode to electrically connect the common voltage supply line 71A to the opposite electrode of the organic light emitting element of the pixel P. Accordingly, the connection electrode layer 72 may supply the common voltage ELVSS supplied from the common voltage supply line 71A to the opposite electrode. The connection electrode layer 72 may be electrically connected to the auxiliary electrode layer 150 in the peripheral area PA, as illustrated in FIGS. 9A to 9C. As illustrated in FIG. 6, the auxiliary electrode layer 150 may be electrically connected to the conductive pattern LDP in the second display area DA2.

Figure 12A:
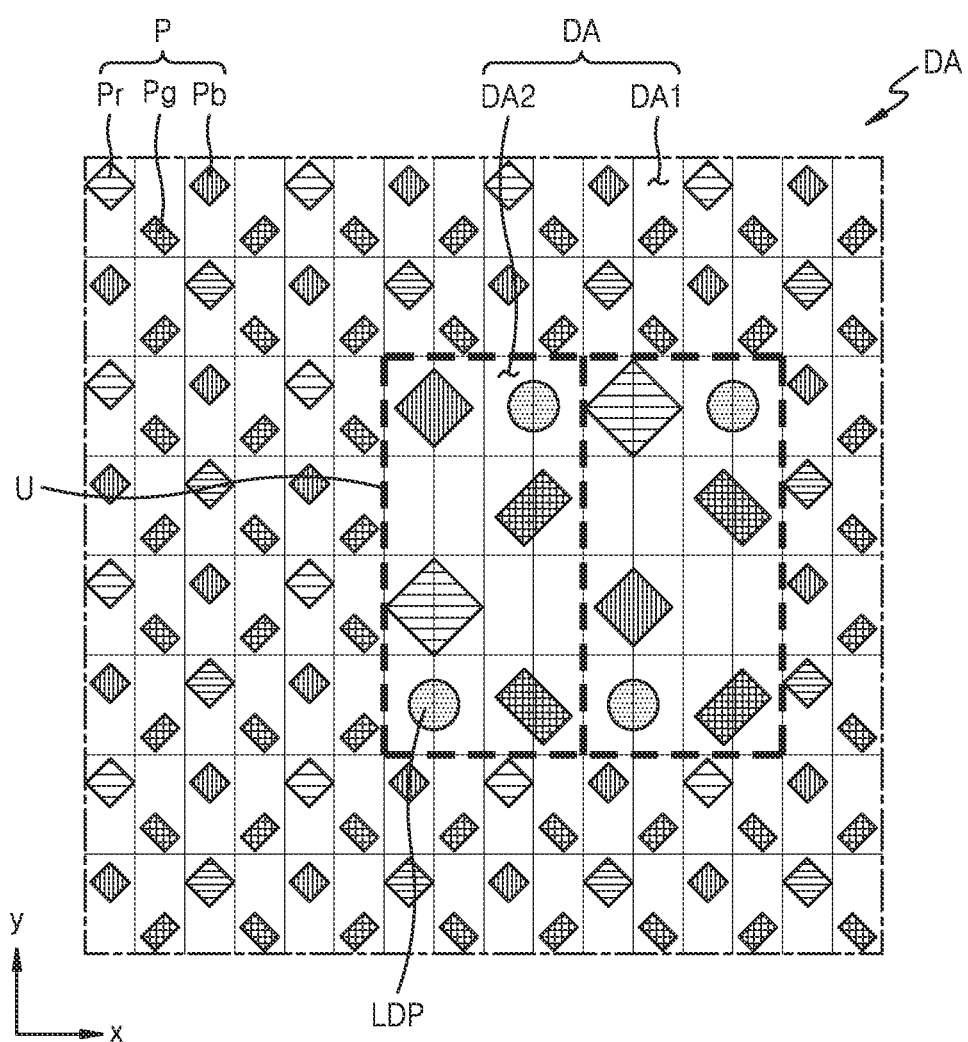
FIGS. 12A, 12B. and 12C are diagrams illustrating a second display area according to an embodiment.
Figure 12B:
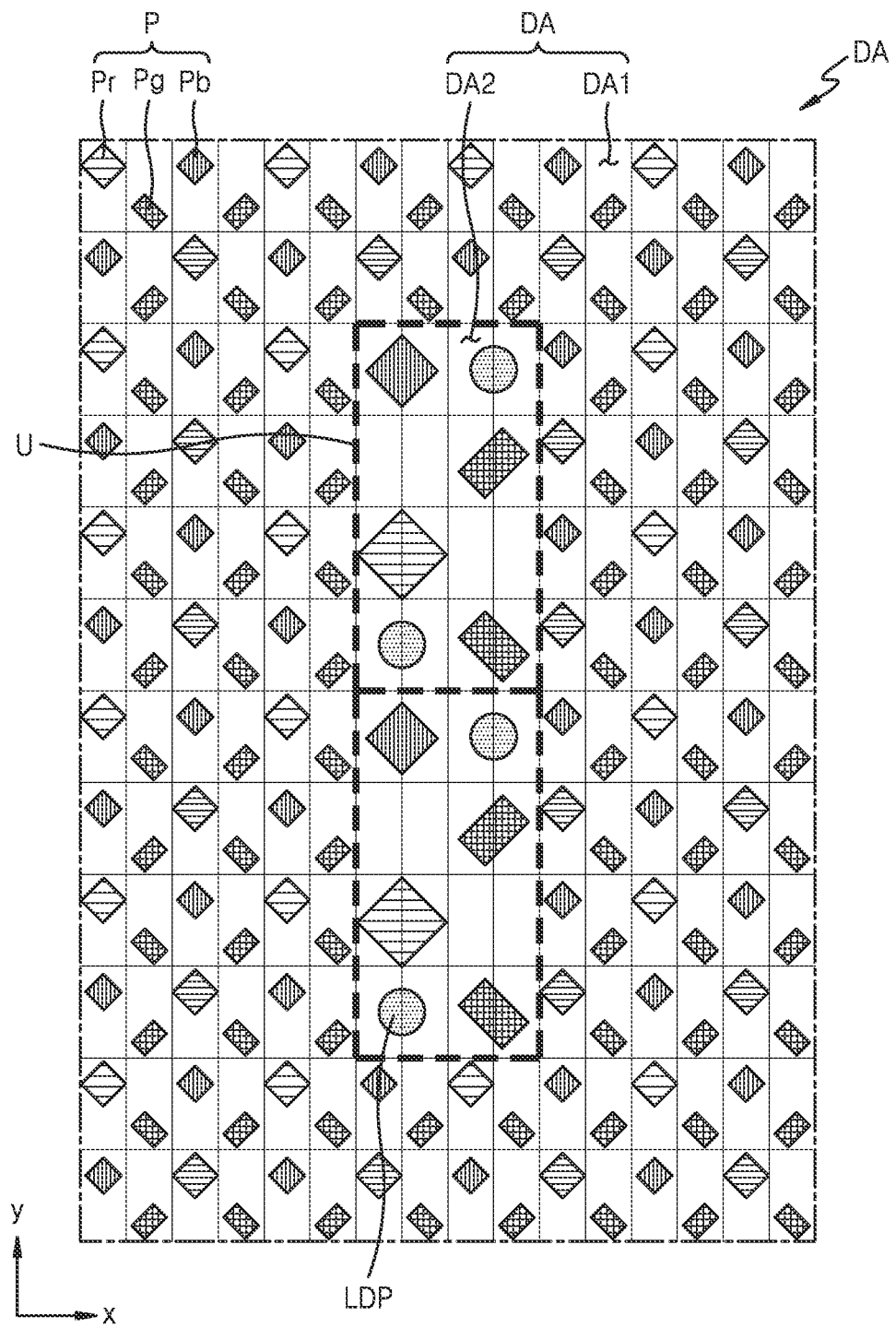
Figure 12C:
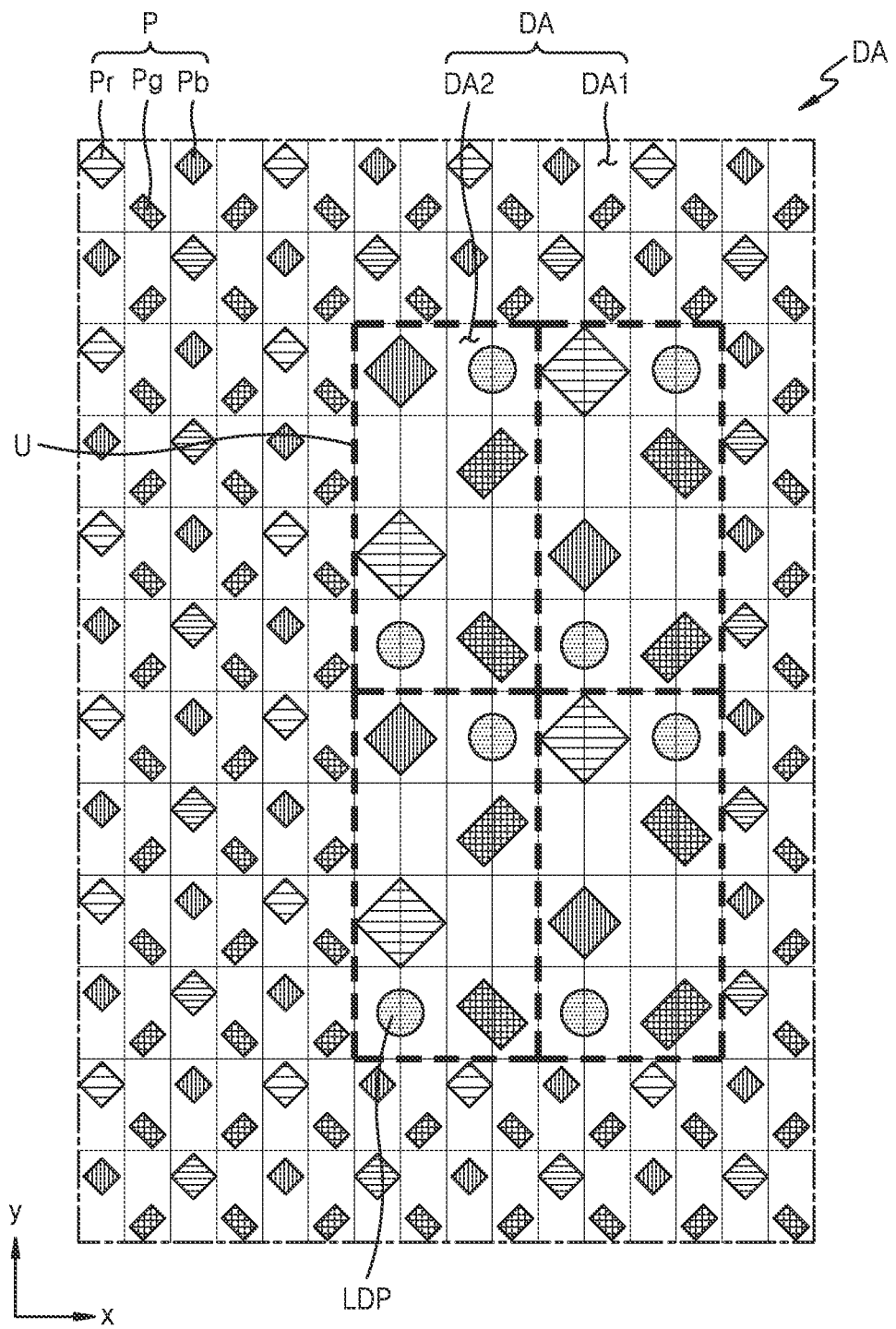

FIGS. 12A, 12B, and 12C are diagrams illustrating a second display area according to an embodiment.

In an embodiment, a basic unit U may be repeatedly arranged in the x-direction in the second display area DA2. FIG. 12A illustrates an example in which two basic units U are repeatedly arranged in the x-direction in the second display area DA2.

In an embodiment, a basic unit U may be repeatedly arranged in the y-direction in the second display area DA2. FIG. 12B illustrates an example in which two basic units U are repeatedly arranged in the y-direction in the second display area DA2.

In an embodiment, a basic unit U may be repeatedly arranged in the x-direction and the y-direction in the second display area DA2. FIG. 12C illustrates an example in which four basic units U are repeatedly arranged in the x-direction and the y-direction in the second display area DA2.

The continuous arrangement form and number of basic units U arranged in the second display area DA2 may be variously determined according to the effect of laser drilling and the ease of pixel arrangement layout. The position and number of conductive patterns LDP may be determined according to the continuous arrangement form and number of basic units U.

Figure 13:
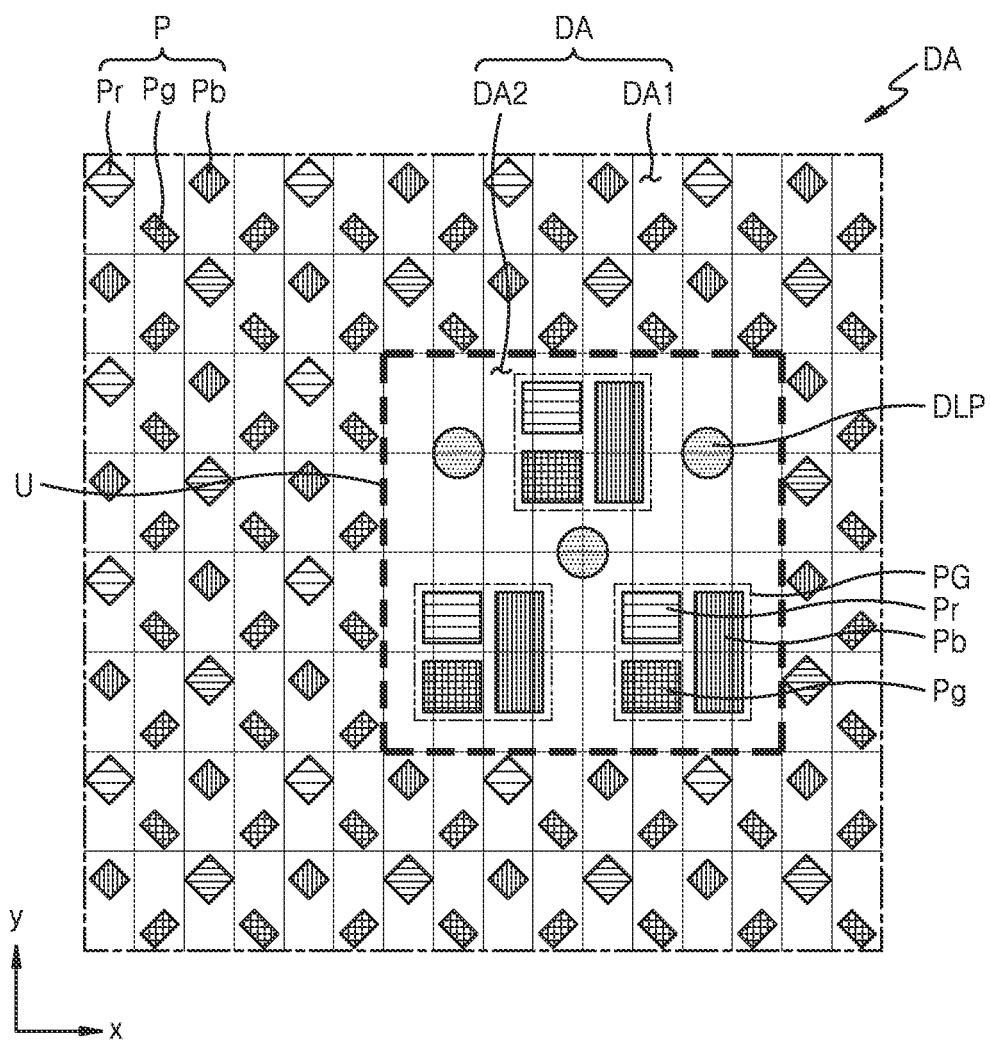
FIG. 13 is a diagram illustrating a portion of a display area according to an embodiment.

FIG. 13 is a diagram illustrating a portion of a display area according to an embodiment.

The pixel arrangement structure of the second display area DA2 may be different from the pixel arrangement structure of the first display area DA1. For example, the pixel arrangement structure of the first display area DA1 may be a pentile structure, and the pixel arrangement structure of the second display area DA2 may be a pixel arrangement structure different from the pentile structure, such as a stripe structure, an S-stripe structure, a mosaic structure, or a delta structure.

FIG. 13 illustrates an example in which the first display area DA1 has a pixel arrangement of a pentile structure and the second display area DA2 has a pixel arrangement of an S-stripe structure. In the S-stripe structure, the red pixel Pr and the green pixel Pg may be arranged adjacent to each other in the y-direction, and the blue pixel Pb may be arranged adjacent to the red pixel Pr and the green pixel Pg in the x-direction. In this case, the red pixel Pr and the green pixel Pg may have a rectangular shape having a long side in the x-direction, and the blue pixel Pb may have a rectangular shape having a long side in the y-direction. The y-direction length of the blue pixel Pb may be equal to or greater than the sum of the y-direction length of the red pixel Pr and the y-direction length of the green pixel Pg. Accordingly, the size of the blue pixel Pb may be greater than the size of each of the red pixel Pr and the green pixel Pg.

When the second display area DA2 has an S-stripe structure, the basic unit U may include three pixel groups PG arranged at certain intervals and each pixel group PG may include a total of three pixels including one red pixel Pr, one green pixel Pg, and one blue pixel Pb.

A certain number of conductive patterns LDP to contact the opposite electrode may be arranged between the pixel groups PG.

Figure 14:
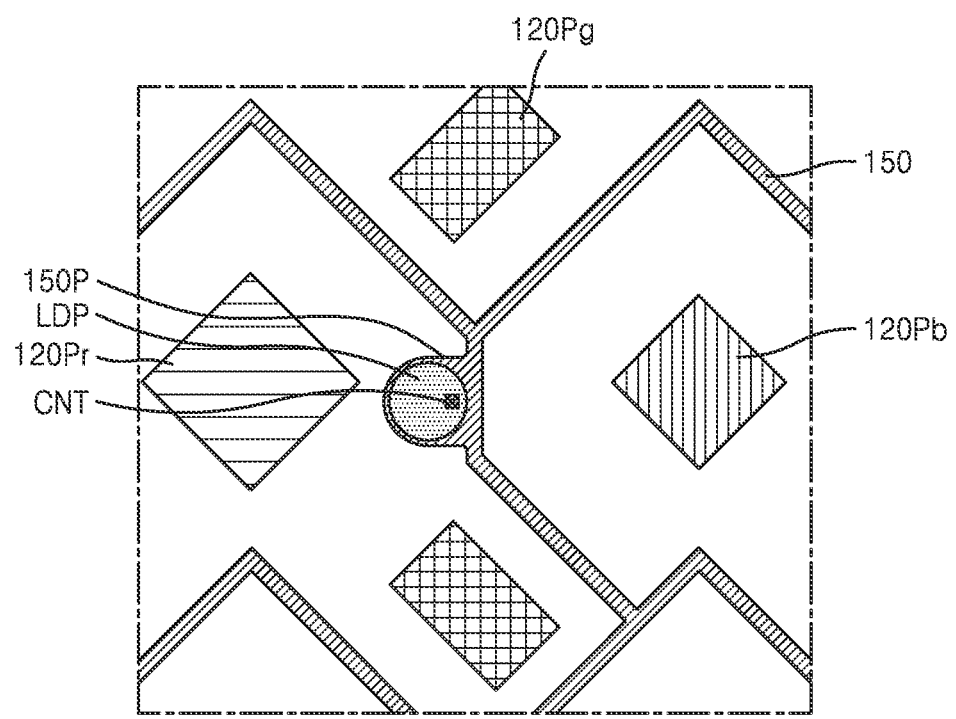
FIGS. 14 and 15A are diagrams illustrating a portion of a second display area according to an embodiment.
Figure 15A:
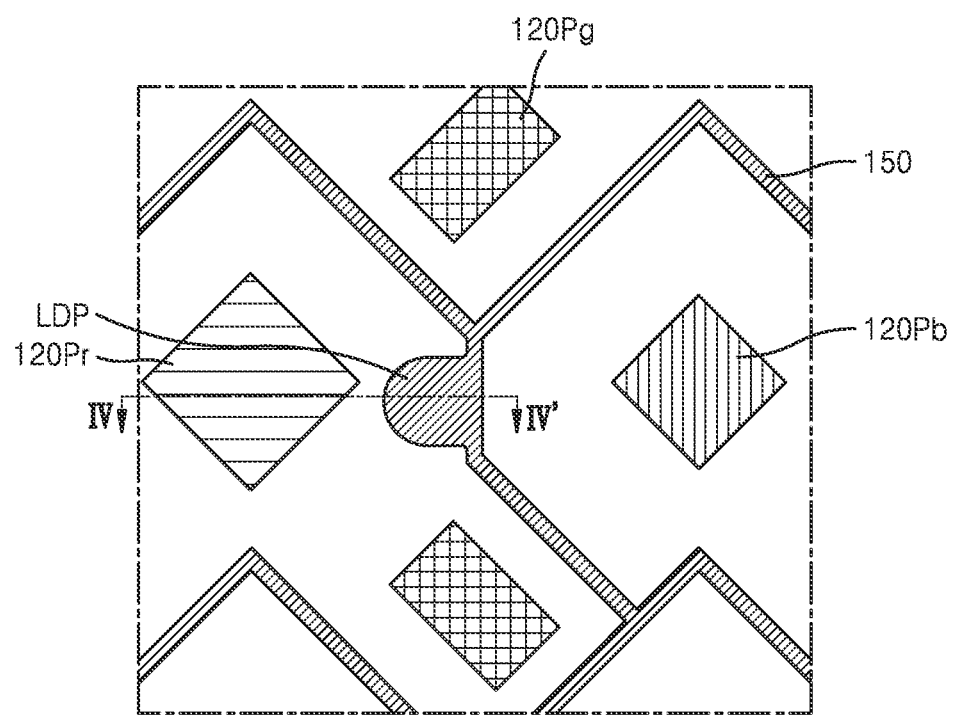
Figure 15B:
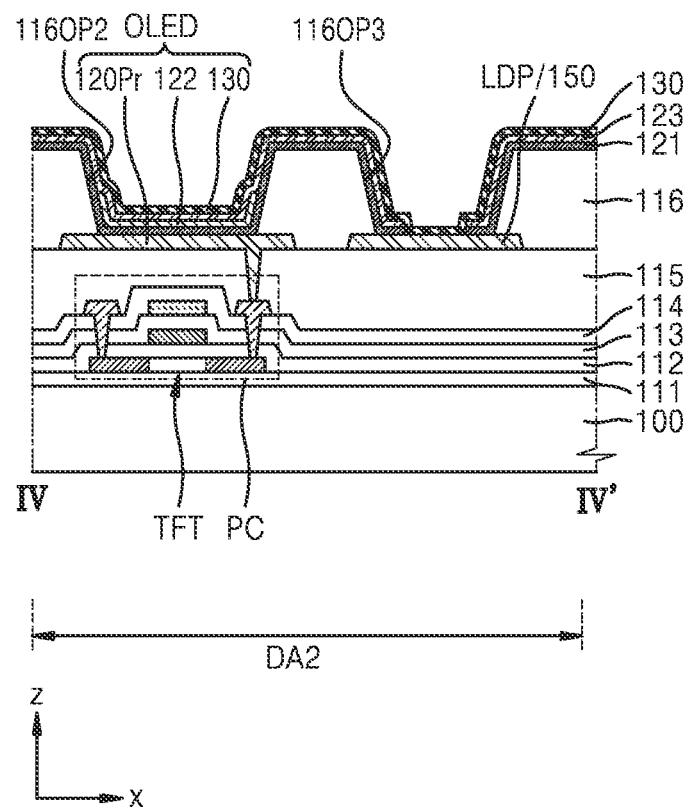
FIG. 15B is a cross-sectional view of the second display area taken along line IV-IV' of FIG. 15A.

FIGS. 14 and 15A are diagrams illustrating a portion of a second display area according to an embodiment. FIG. 15B is a cross-sectional view of the second display area taken along line IV-IV' of FIG. 15A.

As illustrated in FIG. 14, first electrodes 120Pr, 120Pg, and 120Pb as pixel electrodes may be arranged in a certain pattern in the second display area DA2. An auxiliary electrode layer 150 may be arranged in a grid structure of a zigzag form between the first electrodes 120Pr, 120Pg, and 120Pb and may not overlap the first electrodes 120Pr, 120Pg, and 120Pb.

The auxiliary electrode layer 150 may be arranged on a different layer than the first electrodes 120Pr, 120Pg, and 120Pb. In an embodiment, the auxiliary electrode layer 150 may be arranged on a lower layer of the first electrodes 120Pr, 120Pg, and 120Pb.

The conductive pattern LDP may be arranged between the first electrodes 120Pr, 120Pg, and 120Pb. The conductive pattern LDP may be electrically connected to the auxiliary electrode layer 150 by contacting the auxiliary electrode layer 150 through a contact hole CNT of an insulating layer arranged between the conductive pattern LDP and the auxiliary electrode layer 150. The conductive pattern LDP may be electrically connected to a protrusion portion 150P protruding from the auxiliary electrode layer 150.

In other embodiments, as illustrated in FIG. 15A, the conductive pattern LDP and the auxiliary electrode layer 150 may be integrally provided. Referring to FIGS. 15A and 15B, the conductive pattern LDP may correspond to a portion protruding from the auxiliary electrode layer 150, and the conductive pattern LDP and the auxiliary electrode layer 150 may be arranged on the same layer as the first electrodes 120Pr, 120Pg, and 120Pb, and may not overlap the first electrodes 120Pr, 120Pg, and 120Pb. The conductive pattern LDP and the auxiliary electrode layer 150 may be arranged over the planarization layer 115.

A second opening 116OP2 exposing a portion of the first electrodes 120Pr, 120Pg, and 120Pb and a third opening 116OP3 exposing a portion of the conductive pattern LDP may be formed in the pixel definition layer 116 of the second display area DA2. The second electrode 130 of the organic light emitting diode OLED may be provided in the third opening 116OP3 to contact the conductive pattern LDP.

Figure 16:
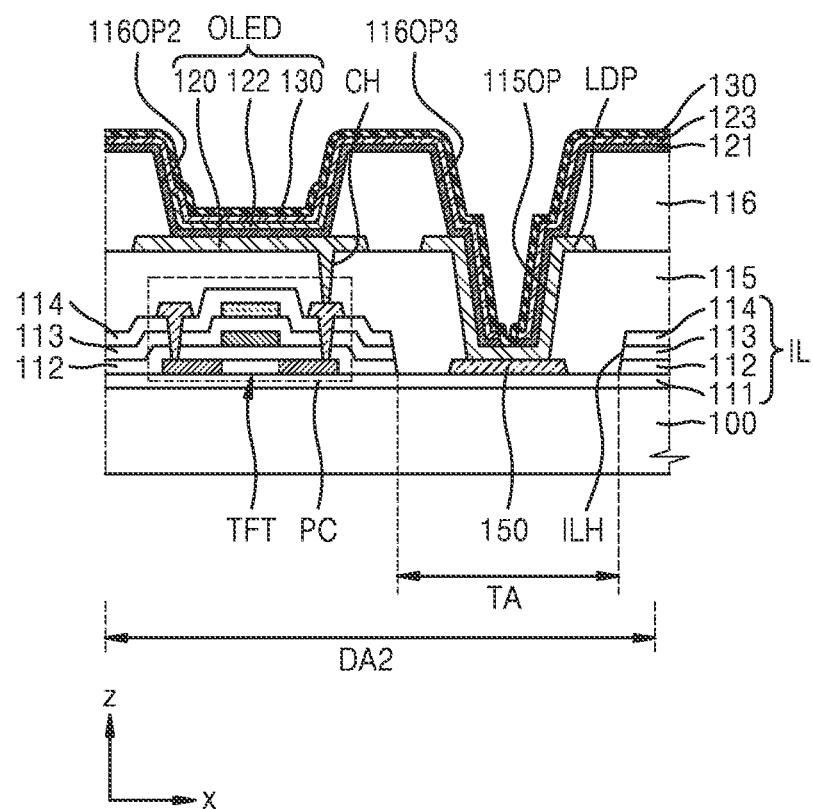
FIG. 16 is a diagram illustrating a portion of a second display area according to an embodiment.

FIG. 16 is a diagram illustrating a portion of a second display area according to an embodiment.

Referring to FIG. 16, the second display area DA2 may include a transmission area TA around a pixel. The transmission area TA may be formed to surround the pixel. At least one insulating layer among the buffer layer 111, the first gate insulating layer 112, the second gate insulating layer 113, and the interlayer insulating layer 114 may be removed from the transmission area TA to increase the transmittance of the second display area DA2.

The buffer layer 111, the first gate insulating layer 112, the second gate insulating layer 113, and the interlayer insulating layer 114 may be collectively referred to as an inorganic insulating layer IL. FIG. 16 illustrates an example in which a hole ILH is formed in the first gate insulating layer 112, the second gate insulating layer 113, and the interlayer insulating layer 114 of the inorganic insulating layer IL.

The auxiliary electrode layer 150 may be arranged over the buffer layer 111 in the hole ILH of the inorganic insulating layer IL. The auxiliary electrode layer 150 may include the same material as one of the gate electrode GE, the lower electrode CE2 of the capacitor Cst, the source electrode SE, and the drain electrode DE.

A planarization layer 115 may be arranged over the inorganic insulating layer IL to cover the source electrode SE, the drain electrode DE, and the auxiliary electrode layer 150. A contact hole CH exposing one of the source electrode SE and the drain electrode DE and an opening 115OP exposing a portion of the auxiliary electrode layer 150 may be formed in the planarization layer 115.

A pixel electrode 120 and a conductive pattern LDP may be arranged over the planarization layer 115. The pixel electrode 120 may contact one of the source electrode SE and the drain electrode DE through the contact hole CH to be electrically connected to the pixel circuit PC. The conductive pattern LDP may be electrically connected to the auxiliary electrode layer 150 through the opening 115OP.

In an embodiment, the display apparatus may further include a component as an electronic element such as at least one sensor arranged under the substrate 100 in the second display area DA2.

As the size of the display panel increases, the luminance degradation due to an IR drop of the common voltage at a center portion of the display panel may increase. For this purpose, an auxiliary electrode contacting the opposite electrode may be required in the display area of the display panel. In the case of a high-resolution panel, a space for contact between the opposite electrode and the auxiliary electrode may be insufficient due to the high integration degree of the pixel circuit.

Embodiments may provide a contact area including a conductive pattern for electrical connection between the opposite electrode and the auxiliary electrode layer in a low-resolution area among a plurality of resolution areas in a display apparatus including a display area of multiple resolutions. The opposite electrode and the conductive pattern may contact each other in the contact area, and the conductive pattern may contact the auxiliary electrode layer such that they may be electrically connected to each other.

Embodiments may include a conductive pattern contacting the opposite electrode in a low-resolution second display area that is a sub display area having a lower pixel circuit integration degree than a high-resolution first display area that is a main display area. Accordingly, even in a high-resolution display apparatus, the luminance degradation due to an IR drop of the opposite electrode may be minimized and thus the image quality thereof may be secured.

As described above, according to embodiments, high-quality display apparatuses may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus including a display area including a first area having a first resolution and a second area having a second resolution that is lower than the first resolution and a non-display area, the display apparatus comprising:
   a conductive pattern arranged in the second area of the display area;
   a pixel electrode arranged in the second area;
   an opposite electrode facing the pixel electrode and electrically contacting the conductive pattern; and
   a first electrode layer arranged in the non-display area and electrically contacting the opposite electrode.

2. The display apparatus of claim 1, wherein the conductive pattern is arranged on a same layer as the pixel electrode.

3. The display apparatus of claim 1, further comprising an insulating layer covering an edge of the pixel electrode, and a first opening corresponding to a portion of the pixel electrode and a second opening corresponding to a portion of the conductive pattern defined in the insulating layer respectively.

4. The display apparatus of claim 3, wherein a third opening corresponding to a portion of a pixel electrode arranged in the first area is further formed in the insulating layer, and
   a size of the first opening is greater than a size of the third opening.

5. The display apparatus of claim 1, further comprising a second electrode layer arranged on a layer between a substrate and the conductive pattern and in direct contact with the conductive pattern in the second area.

6. The display apparatus of claim 5, further comprising:
   a first insulating layer covering the second electrode layer, and a first opening corresponding to a portion of the second electrode layer in the second area defined in the first insulating layer; and
   a second insulating layer arranged over the first insulating layer, covering an edge of the pixel electrode, and a second opening corresponding to a portion of the pixel electrode and a third opening corresponding to a portion of the conductive pattern defined in the first insulating layer respectively,
   wherein the third opening overlaps the first opening.

7. The display apparatus of claim 6, wherein a fourth opening corresponding to a portion of a pixel electrode arranged in the first area is further defined in the second insulating layer, and
   a size of the second opening is greater than a size of the fourth opening.

8. The display apparatus of claim 5, wherein the second electrode layer is electrically connected to the first electrode layer in the non-display area.

9. The display apparatus of claim 1, wherein the first electrode layer includes a same material as the pixel electrode.

10. The display apparatus of claim 1, wherein the second area is uniformly arranged in the display area.

11. The display apparatus of claim 1, wherein the first electrode layer is electrically connected to a second electrode layer including the conductive pattern as a portion in the non-display area.

12. The display apparatus of claim 1, wherein the first electrode layer overlaps a driving circuit of the non-display area.

13. The display apparatus of claim 1, wherein an emission area of an organic light emitting diode including a pixel electrode arranged in the second area is larger than an emission area of an organic light emitting diode including a pixel electrode arranged in the first area.

14. A method of manufacturing a display apparatus including a display area having a first area of a first resolution and a second area of a second resolution that is lower than the first resolution and a non-display area, the method comprising:
   forming a first pixel electrode in the first area of the display area and a second pixel electrode in the second area of the display area respectively;
   forming a conductive pattern in the second area of the display area; and
   forming an opposite electrode facing the first pixel electrode and the second pixel electrode, electrically contacting the conductive pattern in the second area, and electrically contacting, in the non-display area, a first electrode layer arranged in the non-display area.

15. The method of claim 14, wherein the conductive pattern is formed on a same layer as the second pixel electrode.

16. The method of claim 15, further comprising:
forming a pixel definition layer covering the first pixel electrode, the second pixel electrode, and the conductive pattern; and
forming, in the pixel definition layer, a first opening corresponding to the first pixel electrode, a second opening corresponding to the second pixel electrode, and a third opening corresponding to the conductive pattern respectively,
wherein the opposite electrode covers the third opening and contacts the conductive pattern in the third opening.

17. The method of claim 16, further comprising:
forming an emission layer in each of the first opening and the second opening;
forming a functional layer covering the first opening, the second opening, and the third opening; and
removing the functional layer in an area in the third opening corresponding to the conductive pattern by laser drilling,
wherein the opposite electrode contacts the conductive pattern in the area in the third opening where the functional layer is removed.

18. The method of claim 17, further comprising forming a second electrode layer contacting the conductive pattern in the second area provided on a layer between a substrate and the conductive pattern.

19. The method of claim 18, wherein the second electrode layer is electrically connected to the first electrode layer in the non-display area.

20. The method of claim 14, wherein the first electrode layer is electrically connected to a second electrode layer including the conductive pattern as a portion in the non-display area.

* * * * *